(12) United States Patent
Harisaki et al.

(10) Patent No.: US 11,267,931 B2
(45) Date of Patent: Mar. 8, 2022

(54) EPOXY RESIN COMPOSITION

(71) Applicant: SUMITOMO SEIKA CHEMICALS CO., LTD., Hyogo (JP)

(72) Inventors: Ryota Harisaki, Kako-gun (JP); Noriaki Fukuda, Kako-gun (JP); Katsumasa Yamamoto, Kako-gun (JP)

(73) Assignee: SUMITOMO SEIKA CHEMICALS CO., LTD., Hyogo (JP)

( * ) Notice: Subject to any disclaimer, the term of this patent is extended or adjusted under 35 U.S.C. 154(b) by 0 days.

(21) Appl. No.: 16/476,714

(22) PCT Filed: Jan. 9, 2018

(86) PCT No.: PCT/JP2018/000198
§ 371 (c)(1),
(2) Date: Jul. 9, 2019

(87) PCT Pub. No.: WO2018/131567
PCT Pub. Date: Jul. 19, 2018

(65) Prior Publication Data
US 2019/0352448 A1    Nov. 21, 2019

(30) Foreign Application Priority Data

Jan. 10, 2017 (JP) .............................. JP2017-002213

(51) Int. Cl.
| | |
|---|---|
| *C08G 59/20* | (2006.01) |
| *C08G 59/62* | (2006.01) |
| *C08K 5/00* | (2006.01) |
| *C08L 63/04* | (2006.01) |
| *H01L 23/29* | (2006.01) |
| *H01L 23/31* | (2006.01) |
| *H05K 1/03* | (2006.01) |

(52) U.S. Cl.
CPC ........... *C08G 59/20* (2013.01); *C08G 59/621* (2013.01); *C08K 5/0025* (2013.01); *C08L 63/04* (2013.01); *H01L 23/29* (2013.01); *H01L 23/31* (2013.01); *H05K 1/0313* (2013.01)

(58) Field of Classification Search
CPC .... C08G 59/20; C08G 59/621; C08K 5/0025; C08L 63/04; H01L 23/29; H01L 23/31; H05K 1/0313
USPC ......................................................... 525/523
See application file for complete search history.

(56) References Cited

U.S. PATENT DOCUMENTS

| | | | |
|---|---|---|---|
| 3,445,483 A | 5/1969 | Chaffee | |
| 4,801,645 A | 1/1989 | Nishio et al. | |
| 4,954,140 A | 9/1990 | Kawashima et al. | |
| 5,639,413 A | 6/1997 | Crivello | |
| 5,863,970 A | 1/1999 | Ghoshal et al. | |
| 6,194,490 B1 | 2/2001 | Roth et al. | |
| 6,779,656 B2 | 8/2004 | Klettke et al. | |
| 6,908,953 B2 | 6/2005 | Weinmann et al. | |
| 7,235,602 B2 | 6/2007 | Klettke et al. | |
| 7,368,524 B2 | 5/2008 | Eckert et al. | |
| 7,740,482 B2 | 6/2010 | Frances et al. | |
| 7,799,846 B2 | 9/2010 | Eckert et al. | |
| 7,893,130 B2 | 2/2011 | Frances | |
| 8,715,905 B2 | 5/2014 | Tagami et al. | |
| 2003/0035899 A1 | 2/2003 | Klettke et al. | |
| 2004/0122186 A1 | 6/2004 | Herr et al. | |
| 2004/0186202 A1 | 9/2004 | Klettke et al. | |
| 2008/0071035 A1 | 3/2008 | Delsman et al. | |
| 2010/0035003 A1 | 2/2010 | Frances et al. | |
| 2010/0273937 A1 | 10/2010 | Tajima et al. | |
| 2011/0076465 A1 | 3/2011 | Takeda et al. | |
| 2011/0120761 A1 | 5/2011 | Kawai | |
| 2011/0311788 A1 | 12/2011 | Tagami et al. | |
| 2013/0320264 A1 | 12/2013 | Yoshida et al. | |
| 2015/0034980 A1 | 2/2015 | Windisch | |
| 2015/0368397 A1 | 12/2015 | Suwa et al. | |
| 2016/0237202 A1 | 8/2016 | Shiobara et al. | |
| 2016/0255718 A1 | 9/2016 | Xin et al. | |
| 2016/0355711 A1 | 12/2016 | Okamoto et al. | |
| 2016/0357105 A1 | 12/2016 | Asai et al. | |
| 2018/0327595 A1 | 11/2018 | Fukuda et al. | |
| 2018/0334594 A1 | 11/2018 | Nishijima et al. | |
| 2019/0070837 A1 | 3/2019 | Ichioka et al. | |
| 2019/0119434 A1 | 4/2019 | Fukuda et al. | |

FOREIGN PATENT DOCUMENTS

| | | | |
|---|---|---|---|
| EP | 1 679 328 A1 | 7/2006 | |
| EP | 1 765 265 A1 | 3/2007 | |
| EP | 2 397 508 A1 | 12/2011 | |
| GB | 1123960 A | 8/1968 | |
| JP | 5-9270 A | 1/1993 | |
| JP | 05020447 B2 * | 3/1993 | ............. C08G 59/02 |
| JP | 6-192393 A | 7/1994 | |
| JP | 7-157540 A | 6/1995 | |
| JP | 8-325355 A | 12/1996 | |

(Continued)

OTHER PUBLICATIONS

Iketani, JP 05-020447 B2 machine translation in English, Mar. 19, 1993 (Year: 1993).*
Communication dated Mar. 21, 2019, issued by the U.S. Patent and Trademark Office in U.S. Appl. No. 15/776,501.
Extended European Search Report dated Jan. 24, 2019 for EP Patent Application No. 16824381.4 relating to U.S. Appl. Nos. 15/743,189 and 15/776,501.
J. V. Crivello et al., "The Synthesis and Cationic Polymerization of Multifunctional Silicon-Containing Epoxy Monomers and Oligomers", Journal of Polymer Science, Part A: Polymer Chemistry, 1994, pp. 683-697, vol. 32, No. 4.
Tomikazu Ueno, "Elastomer modification of epoxy resin" (modification effect of particulate crosslinked elastomer), 23rd Open Technical Lecture, Japan Society of Epoxy Resin Technology, 1999, 12 pages.

(Continued)

*Primary Examiner* — David T Karst
(74) *Attorney, Agent, or Firm* — Sughrue Mion, PLLC

(57) ABSTRACT

Provided is an epoxy resin composition maintaining excellent adhesion and having low dielectric tangent. Specifically, provided is an epoxy resin composition comprising a specific epoxy resin and a phenol-based curing agent.

12 Claims, No Drawings

(56) References Cited

FOREIGN PATENT DOCUMENTS

| | | | |
|---|---|---|---|
| JP | 9-048839 A | 2/1997 |
| JP | 10-335768 A | 12/1998 |
| JP | 2001-240654 A | 9/2001 |
| JP | 2001-288337 A | 10/2001 |
| JP | 2003-002953 A | 1/2003 |
| JP | 2003-160644 A | 6/2003 |
| JP | 2003-519705 A | 6/2003 |
| JP | 2003-321482 A | 11/2003 |
| JP | 2004-27159 A | 1/2004 |
| JP | 2004-231728 A | 8/2004 |
| JP | 2004-527602 A | 9/2004 |
| JP | 2004-277460 A | 10/2004 |
| JP | 2005-187800 A | 7/2005 |
| JP | 2005-272492 A | 10/2005 |
| JP | 2006-176762 A | 7/2006 |
| JP | 2007-254709 A | 10/2007 |
| JP | 2008-505945 A | 2/2008 |
| JP | 2008-506697 A | 3/2008 |
| JP | 2009-227992 A | 10/2009 |
| JP | 2009-544785 A | 12/2009 |
| JP | 2010-215858 A | 9/2010 |
| JP | 2010-254814 A | 11/2010 |
| JP | 2011-094115 A | 5/2011 |
| JP | 2012-001668 A | 1/2012 |
| JP | 4849654 B2 | 1/2012 |
| JP | 2012-162585 A | 8/2012 |
| JP | 2013-166941 A | 8/2013 |
| JP | 2014-177530 A | 9/2014 |
| JP | 2016-069548 A | 5/2016 |
| JP | 2016-079354 A | 5/2016 |
| JP | 2016-117904 A | 6/2016 |
| JP | 2017-003707 A | 1/2017 |
| JP | 2017-019983 A | 1/2017 |
| JP | 2019-48906 A | 3/2019 |
| WO | 2006/005369 A1 | 1/2006 |
| WO | 2006/019797 A1 | 2/2006 |
| WO | 2012/042796 A1 | 4/2012 |
| WO | 2012/111765 A1 | 8/2012 |
| WO | 2013/140601 A1 | 9/2013 |
| WO | 2014/046095 A1 | 3/2014 |
| WO | 2014/147903 A1 | 9/2014 |
| WO | 2015/041325 A1 | 3/2015 |
| WO | 2015/093281 A1 | 6/2015 |
| WO | 2017/010401 A1 | 1/2017 |
| WO | 2017/086368 A1 | 5/2017 |
| WO | 2018/131563 A1 | 7/2018 |
| WO | 2018/131564 A1 | 7/2018 |
| WO | 2018/131567 A1 | 7/2018 |
| WO | 2018/131569 A1 | 7/2018 |
| WO | 2018/131570 A1 | 7/2018 |
| WO | 2018/131571 A1 | 7/2018 |
| WO | 2018/181719 A1 | 10/2018 |
| WO | 2019/026822 A1 | 2/2019 |
| WO | 2020/262061 A1 | 12/2020 |

OTHER PUBLICATIONS

Xin Yang et al., "Synthesis and Properties of Silphenylene-containing Epoxy Resins with High UV-stability", Journal of Macromolecular Science, Part A: Pure and Applied Chemistry, 2011, pp. 692-700, vol. 48, No. 9.
International Search Report for PCT/JP2018/000200 dated Apr. 17, 2018 [PCT/ISA/210] corresponding to U.S. Appl. No. 16/476,679.
International Search Report for PCT/JP2018/000203 dated Apr. 17, 2018 [PCT/ISA/210] corresponding to U.S. Appl. No. 16/476,681.
International Search Report for PCT/JP2018/000198 dated Apr. 17, 2018 [PCT/ISA/210].
International Search Report for PCT/JP2018/000202 dated Apr. 17, 2018 [PCT/ISA/210] corresponding to U.S. Appl. No. 16/476,695.
International Search Report for PCT/JP2018/000192 dated Apr. 17, 2018 [PCT/ISA/210] corresponding to U.S. Appl. No. 16/476,721.
International Search Report of PCT/JP2016/084031 dated Jan. 31, 2017 [PCT/ISA/210] corresponding to U.S. Appl. No. 15/776,501.
International Search Report for PCT/JP2018/013257 dated Jun. 26, 2018 [PCT/ISA/210] relating to U.S. Appl. Nos. 15/743,189 and 15/776,501.
International Search Report for PCT/JP2016/070158 dated Sep. 20, 2016 [PCT/ISA/210] corresponding to U.S. Appl. No. 15/743,189.
U.S. Appl. No. 16/476,679, Noriaki Fukuda, filed Jul. 9, 2019.
U.S. Appl. No. 16/476,681, Noriaki Fukuda, filed Jul. 9, 2019.
U.S. Appl. No. 16/476,695, Noriaki Fukuda, filed Jul. 9, 2019.
U.S. Appl. No. 16/476,721, Noriaki Fukuda, filed Jul. 9, 2019.
Extended European Search Report dated Jun. 9, 2020, issued by the European Patent Office in European application No. 18738880.6.
Extended European Search Report dated Jun. 23, 2020, issued by the European Patent Office in European application No. 18738684.2.
Non-Final Office Action dated Dec. 10, 2020 issued in U.S. Appl. No. 16/882,016.
Non-Final Office Action dated Jan. 1, 2021 issued in U.S. Appl. No. 16/476,681.
Final Office Action dated Sep. 27, 2021 issued in U.S. Appl. No. 16/476,695.
Communication dated May 7, 2021 issued by the European Patent Office in EP application No. 18738683.4, corresponding to U.S. Appl. No. 16/476,721.
"Poly (2,6-dimethyl-1,4-phenylene oxide) analytical standard", Website Sigma Aldrich, PPE, article 181803, Apr. 23, 2021, pp. 1-2 (2 pages total).
Office Action dated Apr. 2, 2021 from the U.S. Appl. No. 16/476,679.
Office Action dated Feb. 5, 2021 issued by the USPTO in U.S. Appl. No. 16/476,721.

* cited by examiner

EPOXY RESIN COMPOSITION

CROSS REFERENCE TO RELATED APPLICATIONS

This application is a National Stage of International Application No. PCT/JP2018/000198 filed Jan. 9, 2018, claiming priority based on Japanese Patent Application No. 2017-002213 filed Jan. 10, 2017.

TECHNICAL FIELD

The present invention relates to an epoxy resin composition, a method for producing the same, use of the composition, etc.

BACKGROUND ART

Along with the recent increased frequency in printed circuit boards, there has been increasing demand for components that constitute the printed circuit boards to have low dielectric characteristics. When printed circuit boards are produced, epoxy resins, thermosetting unsaturated polyester resins, phenol resins, etc., are used as adhesives. Epoxy resins are used for most currently used adhesives. Further, phenol-based curing agents are often used as curing agents for epoxy resins, in terms of heat resistance. However, the low dielectric characteristics of such resin-cured products (adhesives) do not sufficiently satisfy recent demand.

As another approach to respond to higher frequency, for example, when copper foil is used, the roughness of the surface of the copper foil bonded to an insulating material is reduced. In accordance with an increase in transmission frequency, electric current concentrically flows into the surface portion of the copper foil. Thus, as the surface roughness of the copper foil increases, impedance also increases, consequently largely affecting transmission loss. Accordingly, when copper foil is used, the copper foil is desired to have the lowest possible roughness, in order to respond to higher frequency. However, the adhesion between the copper foil and the insulating material is reduced as the rough surface of the copper foil has less roughness. Therefore, development of insulating materials having sufficient adhesion to copper foil with low roughness and having excellent low dielectric tangent has been expected.

For example, PTL 1 indicates that a specific epoxy resin composition comprising a specific phenol-based curing agent has excellent adhesion. The composition of PTL 1 has high adhesion to copper foil; however, low dielectric characteristics are nowhere mentioned in PTL 1.

CITATION LIST

Patent Literature

PTL 1: JP2007-254709A
PTL 2: GB1123960B

SUMMARY OF INVENTION

Technical Problem

Accordingly, an object of the present invention is to provide an epoxy resin composition that maintains excellent adhesion and has low dielectric characteristics (particularly low dielectric tangent).

Solution to Problem

As a result of extensive research to solve the above problem, the present inventors found that an epoxy resin composition comprising a phenol-based curing agent and a specific epoxy resin containing a silicon atom has excellent adhesion and low dielectric characteristics. The present invention has been completed upon further studies based on this finding.

The present invention includes the main subjects described in the following items.

Item 1. An epoxy resin composition comprising an epoxy resin and a phenol-based curing agent, the epoxy resin being represented by the formula (1):

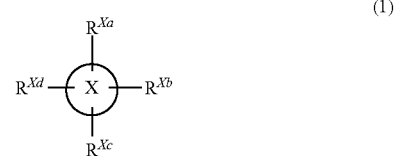

(1)

wherein X ring is a saturated hydrocarbon ring or an unsaturated hydrocarbon ring, or rings having a structure in which 2 to 6 saturated hydrocarbon rings and/or unsaturated hydrocarbon rings are condensed, or in which 2 saturated hydrocarbon rings and/or unsaturated hydrocarbon rings are connected;

$R^{Xa}$, $R^{Xb}$, $R^{Xc}$, and $R^{Xd}$ are the same or different, and each is a hydrogen atom, a lower alkyl group, a lower alkoxy group, a lower alkenyl group, a halogen atom, or a group represented by the formula (3):

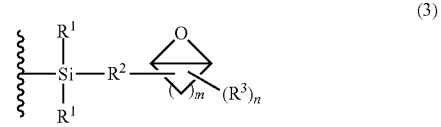

(3)

wherein $R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

m is an integer of 0 to 6; and n is an integer of 0 to 3;

provided that at least one of $R^{Xa}$, $R^{Xb}$, $R^{Xc}$, and $R^{Xd}$ is a group represented by the formula (3); and one or more hydrogen atoms bonded to one or more carbon atoms that constitute the hydrocarbon ring constituting the X ring, and that are not bonded to $R^{Xa}$, $R^{Xb}$, $R^{Xc}$, or $R^{Xd}$, may be replaced by a lower alkyl group, a lower alkoxy group, a lower alkenyl group, or a halogen atom.

Item 2. The epoxy resin composition according to Item 1, wherein the rings having a structure in which 2 saturated hydrocarbon rings and/or unsaturated hydrocarbon rings are connected are rings represented by the formula (2):

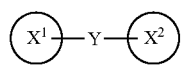

(2)

wherein $X^1$ ring and $X^2$ ring are the same or different, and each is a saturated hydrocarbon ring or an unsaturated hydrocarbon ring; and Y is a bond, a $C_{1-6}$ alkylene group that may be substituted with a $C_{1-4}$ alkyl group, an oxygen atom (—O—), a sulfur atom (—S—), —SO—, or —SO$_2$—.

Item 3. The epoxy resin composition according to Item 1 or 2, wherein the saturated hydrocarbon ring is a $C_{4-8}$ saturated hydrocarbon ring, and the unsaturated hydrocarbon ring is a $C_{4-8}$ unsaturated hydrocarbon ring.

Item 4. The epoxy resin composition according to Item 1, wherein the composition comprises a phenol-based curing agent and at least one epoxy resin selected from the group consisting of:

an epoxy resin represented by the formula (1-iia):

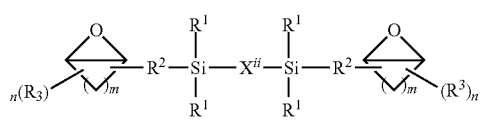

(1-iia)

wherein $X^{ii}$ is a divalent group obtained by removing two hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a divalent group represented by the formula ($2^g$-iia):

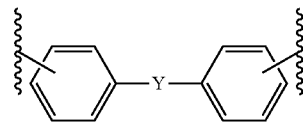

($2^g$-iia)

wherein Y is a bond, a $C_{1-6}$ alkylene group that may be substituted with a $C_{1-4}$ alkyl group, an oxygen atom (—O—), a sulfur atom (—S—), —SO—, or —SO$_2$—;

$R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

m is an integer of 0 to 6; and
n is an integer of 0 to 3; and
an epoxy resin represented by the formula (1-iiia):

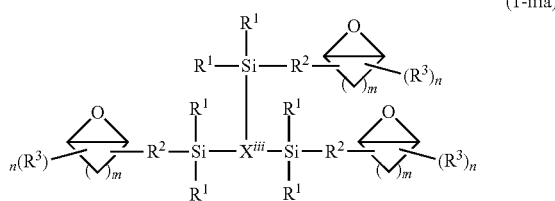

(1-iiia)

wherein $X^{iii}$ is a trivalent group obtained by removing three hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a trivalent group represented by the formula ($2^g$-iiia):

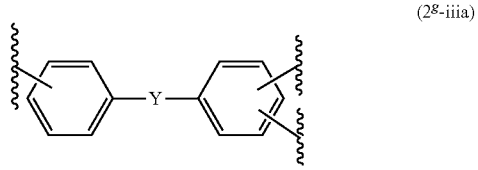

($2^g$-iiia)

wherein Y is as defined above; and
$R^1$, $R^2$, $R^3$, m, and n are as defined above.

Item 5. The epoxy resin composition according to any one of Items 1 to 4, wherein the phenol-based curing agent is at least one resin selected from the group consisting of a novolak-type phenol resin, a resol-type phenol resin, and an aralkyl-type phenol resin.

Item 6. The epoxy resin composition according to any one of Items 1 to 5, wherein the phenol-based curing agent is at least one resin selected from the group consisting of:
a resin represented by the formula (7):

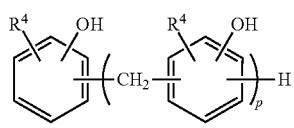

(7)

wherein $R^4$ is the same or different, and is a hydrogen atom, a lower alkyl group, or a lower alkylol group; and p is an average value of 1 to 30; and
a resin represented by the formula (8):

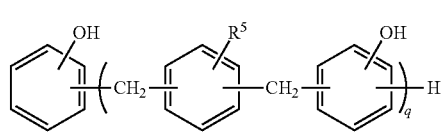

(8)

wherein $R^5$ is the same or different, and is a hydrogen atom or a lower alkyl group; and q is an average value of 1 to 15.

Item 7. The epoxy resin composition according to any one of Items 1 to 6, further comprising a curing accelerator.

Item 8. A varnish comprising the epoxy resin composition according to any one of Items 1 to 7 and an organic solvent.

Item 9. A cured product of the epoxy resin composition according to any one of Items 1 to 7.

Item 10. A semiconductor sealing material, a liquid sealing material, a potting material, a sealing material, an interlayer insulation film, an adhesive layer, a coverlay film, an electromagnetic shielding film, a printed circuit board material, or a composite material, each of which uses (preferably comprises) the epoxy resin composition according to any one of Items 1 to 7, the varnish according to Item 8, or the cured product according to Item 9.

Item 11. The epoxy resin composition according to any one of Items 1 to 7, the varnish according to Item 8, or the cured product according to Item 9 for use in a semiconductor sealing material, a liquid sealing material, a potting material, a sealing material, an interlayer insulation film, an adhesive layer, a coverlay film, an electromagnetic shielding film, a printed circuit board material, or a composite material.

Item 12. Use of the epoxy resin composition according to any one of Items 1 to 7, the varnish according to Item 8, or the cured product according to Item 9 for producing a semiconductor sealing material, a liquid sealing material, a potting material, a sealing material, an interlayer insulation film, an adhesive layer, a coverlay film, an electromagnetic shielding film, a printed circuit board material, or a composite material.

Advantageous Effects of Invention

A cured product of the epoxy resin composition of the present invention maintains sufficient adhesion and has good low dielectric tangent. Therefore, the epoxy resin composition of the present invention can be suitably used for semiconductor sealing materials, liquid sealing materials, potting materials, sealing materials, interlayer insulation films, adhesive layers, coverlay films, electromagnetic shielding films, printed circuit board materials, composite materials, or the like.

DESCRIPTION OF EMBODIMENTS

The epoxy resin composition of an embodiment of the present invention comprises an epoxy resin and a phenol-based curing agent, the epoxy resin being represented by the formula (1):

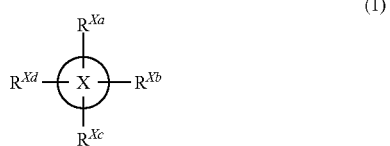
(1)

In the formula (1), $R^{Xa}$, $R^{Xb}$, $R^{Xc}$, and $R^{Xd}$ are the same or different, and each is a hydrogen atom, a lower alkyl group, a lower alkoxy group, a lower alkenyl group, a halogen atom, or a group represented by the formula (3):

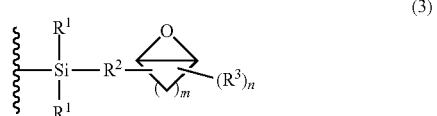
(3)

(hereinafter also referred to as the "group of the formula (3)"). Hereinafter, a lower alkyl group, a lower alkoxy group, and a lower alkenyl group are also collectively referred to as "lower carbon substituents." In the present invention, among the lower carbon substituents, a lower alkyl group or a lower alkoxy group is more preferable.

However, at least one of $R^{Xa}$, $R^{Xb}$, $R^{Xc}$, and $R^{Xd}$ is a group of the formula (3). In other words, three of $R^{Xa}$, $R^{Xb}$, $R^{Xc}$, and $R^{Xd}$ are hydrogen atoms, halogen atoms, or lower carbon substituents, and the other one is a group of the formula (3); two of them are hydrogen atoms, halogen atoms, or lower carbon substituents, and the other two are groups of the formula (3); one of them is a hydrogen atom, a halogen atom, or a lower carbon substituent, and the other three are groups of the formula (3); or all of them are groups of the formula (3). More specifically, for example, $R^{Xa}$ $R^{Xb}$, $R^{Xc}$, and $R^{Xd}$ may be as follows:

(i) $R^{Xa}$, $R^{Xb}$, and $R^{Xc}$ are hydrogen atoms, halogen atoms, or lower carbon substituents, and $R^{Xd}$ is a group of the formula (3);

(ii) $R^{Xa}$ and $R^{Xb}$ are hydrogen atoms, halogen atoms, or lower carbon substituents, and $R^{Xc}$ and $R^{Xd}$ are groups of the formula (3);

(iii) $R^{Xa}$ is a hydrogen atom, a halogen atom, or a lower carbon substituent, and $R^{Xb}$ $R^{Xc}$, and $R^{Xd}$ are groups of the formula (3); or (iv) all of $R^{Xa}$, $R^{Xb}$, $R^{Xc}$, and $R^{Xd}$ are groups of the formula (3). Of $R^{Xa}$ $R^{Xb}$, $R^{Xc}$, and $R^{Xd}$, one or more members that are not groups of the formula (3) are more preferably hydrogen atoms or lower carbon substituents.

In the formula (1), $R^{Xa}$, $R^{Xb}$, $R^{Xc}$, and $R^{Xd}$ may be the same or different. Therefore, (i) when $R^{Xa}$, $R^{Xb}$, and $R^{Xc}$ are hydrogen atoms, halogen atoms, or lower carbon substituents, and when $R^{Xd}$ is a group of the formula (3), $R^{Xa}$, $R^{Xb}$, and $R^{Xc}$ may be the same or different. (ii) When $R^{Xa}$ and $R^{Xb}$ are hydrogen atoms, halogen atoms, or lower carbon substituents, and when $R^{Xc}$ and $R^{Xd}$ are groups of the formula (3), $R^{Xa}$ and $R^{Xb}$ may be the same or different, and $R^{Xc}$ and $R^{Xd}$ may also be the same or different. (iii) When $R^{Xa}$ is a hydrogen atom, a halogen atom, or a lower carbon substituent, and when $R^{Xb}$, $R^{Xc}$, and $R^{Xd}$ are groups of the formula (3), $R^{Xb}$, $R^{Xc}$, and $R^{Xd}$ may be the same or different. (iv) When all of $R^{Xa}$, $R^{Xb}$, $R^{Xc}$, and $R^{Xd}$ are groups of the formula (3), $R^{Xa}$, $R^{Xb}$, $R^{Xc}$, and $R^{Xd}$ may be the same or different. In any of these cases, the groups of the formula (3) are preferably the same.

Moreover, when two or three of $R^{Xa}$ $R^{Xb}$, $R^{Xc}$, and $R^{Xd}$ are halogen atoms or lower carbon substituents, these halogen atoms or lower carbon substituents may also be the same or different. In this case, two or three of $R^{Xa}$, $R^{Xb}$, $R^{Xc}$, and $R^{Xd}$ are more preferably the same lower carbon substituents.

In the present specification, the lower carbon substituent refers to a lower alkyl group, a lower alkoxy group, or a lower alkenyl group. The term "lower" used herein means 1 to 6 (1, 2, 3, 4, 5, or 6) carbon atoms. Of the lower carbon substituents, a lower alkyl group or a lower alkoxy group is preferable. Specifically, preferable examples of lower alkyl groups include a methyl group, an ethyl group, an n-propyl group, an isopropyl group, an n-butyl group, an isobutyl group, and the like. Preferable examples of lower alkoxy groups include a methoxy group, an ethoxy group, a propoxy group, an isopropoxy group, a butoxy group, an isobutoxy group, and the like.

Moreover, in the present specification, the halogen atom is a fluorine atom, a chlorine atom, a bromine atom, or an iodine atom; preferably a fluorine atom, a chlorine atom, or a bromine atom; and more preferably a fluorine atom or a bromine atom.

In the formula (1), X ring is a saturated hydrocarbon ring or an unsaturated hydrocarbon ring, or rings having a structure in which 2 to 6 saturated hydrocarbon rings and/or unsaturated hydrocarbon rings are condensed, or in which 2 saturated hydrocarbon rings and/or unsaturated hydrocarbon rings are connected. In the present specification, the saturated hydrocarbon ring is, for example, preferably a $C_{4-8}$ (4, 5, 6, 7, or 8) saturated hydrocarbon ring, and particularly preferably a cyclopentane ring, a cyclohexane ring, or the like. In the present specification, the unsaturated hydrocarbon ring is, for example, preferably a $C_{4-8}$ (4, 5, 6, 7, or 8) unsaturated hydrocarbon ring, and particularly preferably a benzene ring or the like. In the present specification, the rings having a structure in which 2 to 6 saturated hydrocarbon rings and/or unsaturated hydrocarbon rings are condensed are preferably 2, 3, or 4 condensed saturated hydrocarbon rings and/or unsaturated hydrocarbon rings, and more preferably 2 or 3 condensed saturated hydrocarbon rings and/or unsaturated hydrocarbon rings. More specific examples include a decahydronaphthalene ring, an adamantane ring, a naphthalene ring, a phenanthrene ring, an anthracene ring, a pyrene ring, a triphenylene ring, a tetralin ring, 1,2,3,4,5,6,7,8-octahydronaphthalene ring, a norbornene ring, and the like.

In the present specification, a saturated hydrocarbon ring or an unsaturated hydrocarbon ring, or rings having a structure in which 2 to 6 saturated hydrocarbon rings and/or unsaturated hydrocarbon rings are condensed, are also collectively referred to as "hydrocarbon rings."

The rings having a structure in which 2 saturated hydrocarbon rings and/or unsaturated hydrocarbon rings are connected are preferably rings represented by the formula (2):

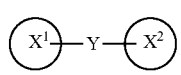

(2)

In the formula (2), $X^1$ ring and $X^2$ ring are the same or different, and each is a saturated hydrocarbon ring or an unsaturated hydrocarbon ring. That is, the $X^1$ ring and $X^2$ ring are both saturated hydrocarbon rings or unsaturated hydrocarbon rings; or one of them is a saturated hydrocarbon ring, and the other is an unsaturated hydrocarbon ring. It is preferable that the $X^1$ ring and the $X^2$ ring be both saturated hydrocarbon rings or unsaturated hydrocarbon rings. For example, it is preferable that the $X^1$ ring and the $X^2$ ring be both benzene rings or cyclohexane rings, or that one of them be a benzene ring and the other be a cyclohexane ring; and it is more preferable that both of them be benzene rings.

Moreover, Y is a bond, a $C_{1-6}$ alkylene group that may be substituted with a $C_{1-4}$ alkyl group, an oxygen atom (—O—), a sulfur atom (—S—), —SO—, or —SO$_2$—. Examples of the $C_{1-6}$ alkylene group include a methylene group, an ethylene group, a trimethylene group, a tetramethylene group, a hexamethylene group, and the like. Moreover, examples of the $C_{1-4}$ alkyl group as a substituent include a methyl group, an ethyl group, an n-propyl group, an isopropyl group, an n-butyl group, an isobutyl group, and the like. Preferable examples of the $C_{1-6}$ alkylene group substituted with a $C_{1-4}$ alkyl group include —CH(CH$_3$)—, —C(CH$_3$)$_2$—, —CH$_2$CH(CH$_3$)CH$_2$—, —CH$_2$C(CH$_3$)$_2$ CH$_2$—, and the like. Y is preferably a bond, an oxygen atom, a methylene group, a dimethylmethylene group, —S—, or —SO$_2$—; and more preferably a bond, a dimethylmethylene group, an oxygen atom, or —SO$_2$—.

The rings represented by the formula (2) are substituted with $R^{Xa}$, $R^{Xb}$, $R^{Xc}$, and $R^{Xd}$. When the X ring of the formula (1) is rings represented by the formula (2), when three of $R^{Xa}$ to $R^{Xd}$ are hydrogen atoms, halogen atoms, or lower carbon substituents, and when the other one is a group of the formula (3), one of the $X^1$ ring and $X^2$ ring may be substituted with a group of the formula (3). In this case, the rings represented by the formula (2) are substituted with 0, 1, 2, or 3 halogen atoms or lower carbon substituents, and (number of halogen atoms or lower carbon substituents substituted in $X^1$ ring: number of halogen atoms or lower carbon substituents substituted in $X^2$ ring) can be (1:0), (0:1), (2:0), (1:1), (0:2), (3:0), (2:1), (1:2), or (0:3). When two of $R^{Xa}$ to $R^{Xd}$ are hydrogen atoms, halogen atoms, or lower carbon substituents, and when the other two are groups of the formula (3), one of the $X^1$ ring and $X^2$ ring may be substituted with 2 groups of the formula (3), or the $X^1$ ring and the $X^2$ ring each may be substituted with a group of the formula (3). It is preferable that the $X^1$ ring and the $X^2$ ring each be substituted with a group of the formula (3). In this case, the rings represented by the formula (2) are substituted with 0, 1, or 2 halogen atoms or lower carbon substituents, and (number of halogen atoms or lower carbon substituents substituted in $X^1$ ring: number of halogen atoms or lower carbon substituents substituted in $X^2$ ring) can be (1:0), (0:1), (2:0), (1:1), or (0:2). When one of $R^{Xa}$ to $R^{Xd}$ is a hydrogen atom, a halogen atom, or a lower carbon substituent, and when the other three are groups of the formula (3), one of the $X^1$ ring and $X^2$ ring may be substituted with 3 groups of the formula (3); the $X^1$ ring may be substituted with 2 groups of the formula (3), and the $X^2$ ring may be substituted with 1 group of the formula (3); or the $X^1$ ring may be substituted with 1 group of the formula (3), and the $X^2$ ring may be substituted with 2 groups of the formula (3). It is preferable that the $X^1$ ring be substituted with 2 groups of the formula (3), and the $X^2$ ring be substituted with 1 group of the formula (3); or that the $X^1$ ring be substituted with 1 group of the formula (3), and the $X^2$ ring be substituted with 2 groups of the formula (3). In this case, the rings represented by the formula (2) are substituted with 0 or 1 halogen atom or lower carbon substituent, and (number of halogen atoms or lower carbon substituents substituted in $X^1$ ring: number of halogen atoms or lower carbon substituents substituted in $X^2$ ring) may be (1:0) or (0:1). When all of $R^{Xa}$ to $R^{Xd}$ are groups of the formula (3), one of the $X^1$ ring and the $X^2$ ring may be substituted with 4 groups of the formula (3); the $X^1$ ring may be substituted with 3 groups of the formula (3), and the $X^2$ ring may be substituted with 1 group of the formula (3); the $X^1$ ring may be substituted with 1 group of the formula (3), and the $X^2$ ring may be substituted with 3 groups of the formula (3); or the $X^1$ ring may be substituted with 2 groups of the formula (3), and the $X^2$ ring may be substituted with 2 groups of the formula (3). It is preferable that the $X^1$ ring be substituted with 2 groups of the formula (3), and the $X^2$ ring be substituted with 2 groups of the formula (3).

As a group of the formula (1), a tetravalent group represented by the formula (1'):

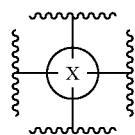
(1')

wherein in the formula (1'), X ring is as defined above; is particularly preferably a group represented by the following formula. Specifically, the group is represented by the following formula:

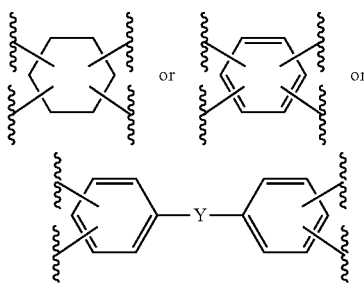
(2^g)

wherein in the formula (2^g), Y is as defined above.

In the formula (3), $R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom (preferably an oxygen atom). The one or more carbon atoms are preferably carbon atoms that are not directly bonded to the silicon atom. The one or more carbon atoms that may be replaced are one or plural (e.g., 2, 3, 4, 5, or 6) carbon atoms, and preferably one carbon atom. In terms of ease of synthesis etc., it is preferable that $R^1$ bonded to the same silicon atom be the same. It is more preferable that all $R^1$ present in the formula (1) be the same.

The $C_{1-18}$ alkyl group represented by $R^1$ is, for example, a linear or branched alkyl group. Examples include a methyl group, an ethyl group, an n-propyl group, an isopropyl group, an n-butyl group, an isobutyl group, a tert-butyl group, an n-pentyl group, a neopentyl group, a tert-pentyl group, an n-hexyl group, an n-heptyl group, a 2,2,4-trimethylpentyl group, an n-octyl group, an isooctyl group, an n-nonyl group, an n-decyl group, an n-dodecyl group, and the like. Preferable is a $C_{1-10}$ alkyl group, more preferable is a $C_{1-6}$ alkyl group, even more preferable is a $C_{1-3}$ alkyl group, and particularly preferable is a methyl group.

The $C_{2-9}$ alkenyl group represented by $R^1$ is, for example, a linear or branched alkenyl group. Examples include a vinyl group, an allyl group, a 2-propenyl group, a butenyl group, a pentenyl group, a hexenyl group, a heptenyl group, an octenyl group, a nonenyl group, and the like. Preferable is a $C_{2-4}$ alkenyl group.

The cycloalkyl group represented by $R^1$ is, for example, a 3- to 8-membered ring cycloalkyl group. Examples include a cyclopentyl group, a cyclohexyl group, a cycloheptyl group, a methylcyclohexyl group, and the like.

The aryl group represented by $R^1$ is, for example, a monocyclic or bicyclic aryl group. Examples include a phenyl group, a tolyl group, a xylyl group, an ethyl phenyl group, a naphthyl group, and the like. Of these, a phenyl group is preferable.

The aralkyl group represented by $R^1$ is, for example, a $C_{1-4}$ alkyl group substituted with an aryl group (particularly a phenyl group). Examples include a benzyl group, an α-phenethyl group, a β-phenethyl group, a β-methylphenethyl group, and the like.

$R^1$ is preferably a $C_{1-3}$ alkyl group, and more preferably a methyl group.

In the formula (3), $R^2$ is a $C_{1-18}$ alkylene group. The alkylene group is a linear or branched alkylene group, and preferably a linear alkylene group. Examples include a methylene group, a methylmethylene group, an ethylmethylene group, a dimethylmethylene group, a diethylmethylene group, a dimethylene group (—$CH_2CH_2$—), a trimethylene group (—$CH_2CH_2CH_2$—), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, and the like. Specific examples include a $C_{2-18}$ alkylene group, preferably a $C_{2-10}$ alkylene group, more preferably a $C_{2-8}$ alkylene group, even more preferably a $C_{2-6}$ alkylene group, and particularly preferably a $C_{2-5}$ alkylene group.

One or more carbon atoms of the $C_{1-18}$ alkylene group may be replaced by at least one atom selected from the group consisting of an oxygen atom and a nitrogen atom (preferably an oxygen atom). The one or more carbon atoms are preferably carbon atoms that are not directly bonded to the silicon atom, and the 3- to 8-membered ring or epoxy ring. Moreover, the one or more carbon atoms that may be replaced are one or plural (e.g., 2, 3, 4, 5, or 6) carbon atoms, and preferably one carbon atom.

When the side of $R^2$ binding to the silicon atom is expressed as (*), examples of this group include (*)—$C_{2-9}$ alkylene-O—$C_{1-8}$ alkylene-, preferably (*)—$C_{2-4}$ alkylene-O—$C_{1-3}$ alkylene-, more preferably (*)—$C_{2-4}$ alkylene-O—$C_{1-2}$ alkylene-, and particularly preferably (*)—$C_3$ alkylene-O-methylene-.

Specific examples include (*)—$(CH_2)_2$—O—$CH_2$—, (*)—$(CH_2)_3$—O—$CH_2$—, (*)—$(CH_2)_3$—O—$(CH_2)_2$—, (*)—$(CH_2)_5$—O—$(CH_2)_4$—, and the like; of these, (*)—$(CH_2)_3$—O—$CH_2$ is preferable.

In the formula (3), m is an integer of 0 to 6 (i.e., 0, 1, 2, 3, 4, 5, or 6). Moreover, n is an integer of 0 to 3 (i.e., 0, 1, 2, or 3). The group bonded to $R^2$ of the formula (3) (on the side not binding to the silicon atom) is represented by the formula (4) (hereafter also referred to as "the group of the formula (4)"), as shown below.

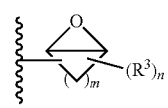
(4)

The group of the formula (4) wherein m is an integer of 1 to 6 is specifically described by the following structural formulas.

When m=1,

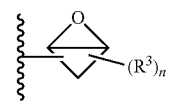

When m=2,

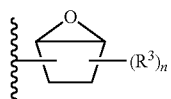

When m=3,

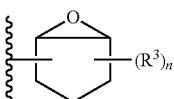

When m=4,

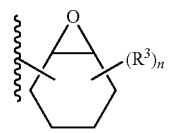

When m=5,

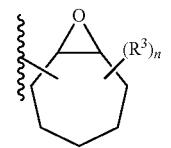

When m=6,

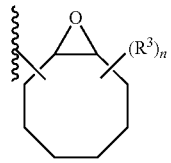

When m is 0, only an epoxy ring remains, and n is an integer of 0 to 3; thus, the group of the formula (4) is a group represented by any of the following formulas:

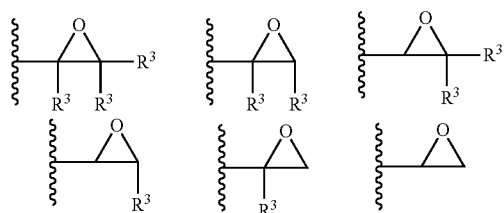

In the formula (3), $R^2$ and $R^3$ bind to a 3- to 8-membered ring or an epoxy ring. n represents the number of $R^3$ binding to the 3- to 8-membered ring or the epoxy ring.

In the formula (3), $R^3$ is the same or different, and is a $C_{1-18}$ alkyl group, a $C_{2-9}$ alkenyl group, a cycloalkyl group, an aryl group, or an aralkyl group. One or more carbon atoms of these groups may be replaced by at least one atom selected from the group consisting of an oxygen atom and a nitrogen atom. The one or more carbon atoms are preferably carbon atoms that are not directly bonded to the 3- to 8-membered ring or epoxy ring. Moreover, the one or more carbon atoms that may be replaced are one or plural (e.g., 2, 3, 4, 5, or 6) carbon atoms, and preferably one carbon atom.

Examples of the $C_{1-18}$ alkyl group, $C_{2-9}$ alkenyl group, cycloalkyl group, aryl group, and aralkyl group represented by $R^3$ include the same corresponding substituents represented by $R^1$ described above.

$R^3$ is preferably a $C_{1-3}$ alkyl group, and more preferably a methyl group or an ethyl group.

Preferable examples of the group of the formula (3) include groups wherein $R^1$, $R^2$, $R^3$, m, and n are as defined above; all $R^1$ are the same; and all $R^3$ are the same (when there are plural $R^3$). The number of this group present in the epoxy resin represented by the formula (1) is 1, 2, 3, or 4; and they may be the same or different, and are preferably the same.

Particularly preferable specific examples of the group of the formula (4) include groups wherein $R^3$ is as defined above; m is 0, 1, 2, 3, or 4; and n is 0, 1, or 2. More preferable among these are, for example, the following groups (all $R^3$ are as defined above):

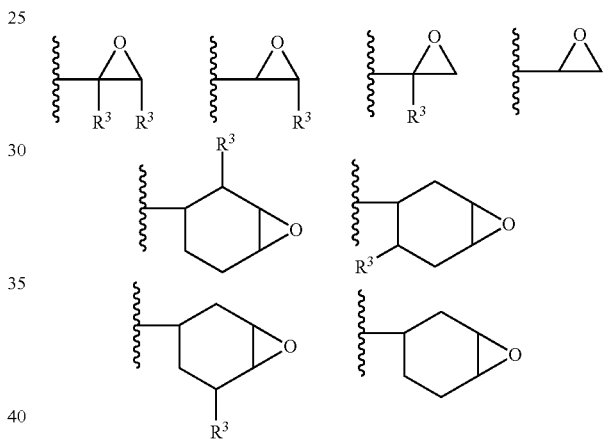

The number of groups of the formula (4) present in the epoxy resin represented by the formula (1) is 1, 2, 3, or 4; and they may be the same or different, and are preferably the same.

Moreover, one or more hydrogen atoms bonded to one or more carbon atoms that constitute the hydrocarbon ring constituting the X ring, and that are not bonded to $R^{Xa}$, $R^{Xb}$, $R^{Xc}$, or $R^{Xd}$, may be replaced by a lower carbon substituent or a halogen atom (preferably a lower carbon substituent). That is, when the X ring is a saturated hydrocarbon ring or an unsaturated hydrocarbon ring, or rings having a structure in which 2 to 6 saturated hydrocarbon rings and/or unsaturated hydrocarbon rings are condensed, one or more hydrogen atoms bonded to one or more carbon atoms that constitute these rings, and that are not bonded to $R^{Xa}$, $R^{Xb}$, $R^{Xc}$, or $R^{Xd}$, may be replaced by a lower carbon substituent or a halogen atom (preferably a lower carbon substituent). When the X ring is rings having a structure in which 2 saturated hydrocarbon rings and/or unsaturated hydrocarbon rings are connected, one or more hydrogen atoms bonded to one or more carbon atoms that constitute theses connected saturated hydrocarbon rings and/or unsaturated hydrocarbon rings, and that are not bonded to $R^{Xa}$, $R^{Xb}$, $R^{Xc}$, or $R^{Xd}$, may be replaced by a lower carbon substituent or a halogen atom (preferably a lower carbon substituent). When the case in which the X ring is rings represented by the formula (2) is explained in detail, one or more hydrogen atoms bonded to one or more carbon atoms that constitute the $X^1$ ring and $X^2$ ring, and that are not bonded to $R^{Xa}$, $R^{Xb}$, $R^{Xc}$, or $R^{Xd}$, may be replaced by a lower carbon substituent or a halogen atom (preferably a lower carbon substituent).

In the present specification, carbon atoms that constitute the hydrocarbon ring constituting the X ring, and that are not bonded to $R^{Xa}$, $R^{Xb}$, $R^{Xc}$, and $R^{Xd}$, are also referred to as "$R^{Xa-d}$ non-binding carbon atoms."

The lower carbon substituent or halogen atom that may replace one or more hydrogen atoms bonded to one or more $R^{Xa-d}$ non-binding carbon atoms is preferably singly bonded to one $R^{Xa-d}$ non-binding carbon atom. That is, when hydrogen atoms bonded to $R^{Xa-d}$ non-binding carbon atoms are replaced, only one of the hydrogen atoms bonded to the $R^{Xa-d}$ non-binding carbon atoms is preferably replaced by a lower carbon substituent or halogen atom. Moreover, the number of substituents (i.e., the total number of lower carbon substituents and halogen atoms) is more preferably less than the number of $R^{Xa-d}$ non-binding carbon atoms. More specifically, the number of substituents is preferably 1 to 6 (1, 2, 3, 4, 5, or 6), more preferably 1 to 4, and even more preferably 1 or 2. Particularly when the X ring is rings represented by the formula (2), one or more hydrogen atoms to be replaced are preferably hydrogen atoms bonded to carbon atoms that are not bonded to Y.

When at least one of $R^{Xa}$, $R^{Xb}$, $R^{Xc}$, and $R^{Xd}$ is a lower carbon substituent, and when at least one lower carbon substituent is bonded to an $R^{Xa-d}$ non-binding carbon atom, all of the lower carbon substituents are preferably the same. That is, when there are lower carbon substituents among $R^{Xa}$, $R^{Xb}$, $R^{Xc}$, and $R^{Xd}$, and when there are lower carbon substituents bonded to $R^{Xa-d}$ non-binding carbon atoms, all of the lower carbon substituents are preferably the same. Moreover, when at least one of $R^{Xa}$, $R^{Xb}$, $R^{Xc}$, and $R^{Xd}$ is a halogen atom, and when at least one halogen atom is bonded to an $R^{Xa-d}$ non-binding carbon atom, all of the halogen atoms are preferably the same. That is, when there are halogen atoms among $R^{Xa}$, $R^{Xb}$, $R^{Xc}$, and $R^{Xd}$, and when there are halogen atoms bonded to $R^{Xa-d}$ non-binding carbon atoms, all of the halogen atoms are preferably the same.

More specifically, for example, when the tetravalent group represented by the above formula (1') is the following:

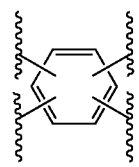

preferable examples of the epoxy resin represented by the formula (1) include an epoxy resin represented by the formula (1-X1):

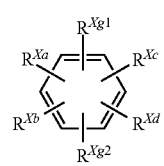

(1-X1)

wherein in the formula (1-X1), $R^{Xa}$, $R^{Xb}$, $R^{Xc}$, and $R^{Xd}$ are as defined above; and $R^{Xg1}$ and $R^{Xg2}$ are the same or different, and each is a hydrogen atom, a lower alkyl group, a lower alkoxy group, or a lower alkenyl group.

In the formula (1-X1), $R^{Xa}$, $R^{Xb}$, $R^{Xc}$, $R^{Xd}$, $R^{Xg1}$, and $R^{Xg2}$ are more preferably each bonded to a different carbon atom on the benzene ring. Among the epoxy resins represented by the formula (1-X1), one wherein $R^{Xg1}$ and $R^{Xg2}$ are hydrogen atoms is preferable.

More preferable examples of the epoxy resin represented by the formula (1-X1) include:

an epoxy resin represented by the formula (1-X1a):

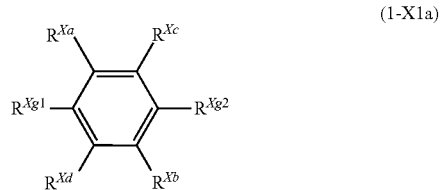

(1-X1a)

wherein in the formula (1-X1a), $R^{Xa}$, $R^{Xb}$, $R^{Xc}$, and $R^{Xd}$ are as defined above; and $R^{Xg1}$ and $R^{Xg2}$ are as defined above; and an epoxy resin represented by the formula (1-X1b):

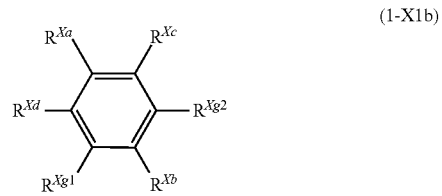

(1-X1b)

wherein in the formula (1-X1b), $R^{Xa}$, $R^{Xb}$, $R^{Xc}$, and $R^{Xd}$ are as defined above; and $R^{Xg1}$ and $R^{Xg2}$ are as defined above.

More preferable among the epoxy resins represented by the formula (1-X1a) are, for example, those wherein $R^{Xa}$ and $R^{Xb}$ are hydrogen atoms, $R^{Xc}$ and $R^{Xd}$ are groups of the formula (3), and $R^{Xg1}$ and $R^{Xg2}$ are hydrogen atoms; and those wherein $R^{Xa}$ and $R^{Xc}$ are hydrogen atoms, $R^{Xb}$ and $R^{Xd}$ are groups of the formula (3), and $R^{Xg1}$ and $R^{Xg2}$ are hydrogen atoms.

More preferable among the epoxy resins represented by the formula (1-X1b) are, for example, those wherein $R^{Xa}$ is a hydrogen atom, $R^{Xb}$, $R^{Xc}$, and $R^{Xd}$ are groups of the formula (3), and $R^{Xg1}$ and $R^{Xg2}$ are hydrogen atoms.

Moreover, when the tetravalent group represented by the above formula (1') is a group represented by the following formula:

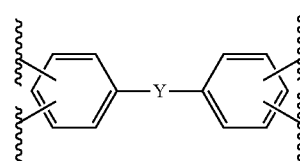

(2g)

wherein in the formula (2g), Y is as defined above; preferable examples of the epoxy resin represented by the formula (1) also include an epoxy resin represented by the formula (1-X2):

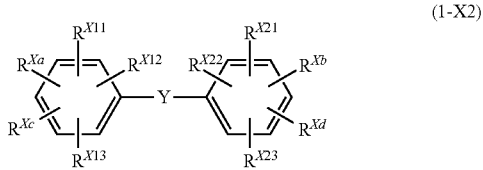

(1-X2)

wherein in the formula (1-X2), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group.

In the formula (1-X2), $R^{Xa}$, $R^{Xc}$, $R^{X11}$, $R^{X12}$, and $R^{X13}$ preferably each bind to a different carbon atom; and $R^{Xb}$, $R^{Xd}$, $R^{X21}$, $R^{X22}$, and $R^{X23}$ more preferably each bind to a different carbon atom. None of $R^{Xa}$, $R^{Xb}$, $R^{Xc}$, $R^{Xd}$, $R^{X11}$, $R^{X12}$, $R^{X13}$, $R^{X21}$, $R^{X22}$, and $R^{X23}$ binds to a carbon atom bonded to Y.

More preferable among the epoxy resins represented by the formula (1-X2) are:

an epoxy resin represented by the formula (1-X2a):

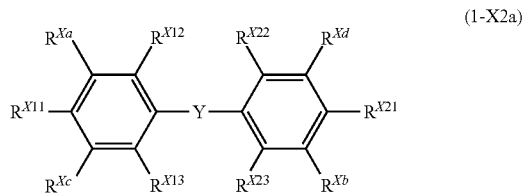

(1-X2a)

wherein in the formula (1-X2a), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group;

an epoxy resin represented by the formula (1-X2b):

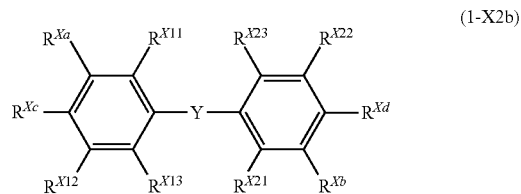

(1-X2b)

wherein in the formula (1-X2b), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group; and an epoxy resin represented by the formula (1-X2c):

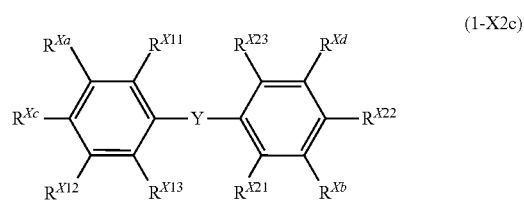

(1-X2c)

wherein in the formula (1-X2c), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group.

More preferable among the epoxy resins represented by the formula (1-X2a) are, for example, those wherein $R^{Xa}$, $R^{Xb}$, $R^{Xc}$, and $R^{Xd}$ are groups of the formula (3); $R^{X11}$ and $R^{X21}$ are lower carbon substituents; and $R^{X12}$, $R^{X13}$, $R^{X22}$, and $R^{X23}$ are hydrogen atoms. Particularly preferable are those wherein Y is a $C_{1-6}$ alkylene group that may be substituted with a $C_{1-4}$ alkyl group (particularly —C(CH$_3$)$_2$—); $R^{Xa}$, $R^{Xb}$, $R^{Xc}$, and $R^{Xd}$ are groups of the formula (3); $R^{X11}$ and $R^{X21}$ are lower alkoxy groups; and $R^{X12}$, $R^{X13}$, $R^{X22}$, and $R^{X23}$ are hydrogen atoms. In these cases, it is more preferable that all of the groups of the formula (3) as $R^{Xa}$, $R^{Xb}$, $R^{Xc}$, and $R^{Xd}$ be the same, and that the lower carbon substituents as $R^{X11}$ and $R^{X21}$ be the same.

Preferable among the epoxy resins represented by the formula (1-X2b) are, for example, those wherein $R^{Xa}$ and $R^{Xb}$ are hydrogen atoms; $R^{Xc}$ and $R^{Xd}$ are groups of the formula (3); and $R^{X11}$, $R^{X12}$, $R^{X13}$, $R^{X21}$ $R^{X22}$, and $R^{X23}$ are hydrogen atoms. In this case, it is more preferable that the groups of the formula (3) as $R^{Xc}$ and $R^{Xd}$ be the same.

Preferable among the epoxy resins represented by the formula (1-X2c) are, for example, those wherein $R^{Xa}$ is a hydrogen atom; $R^{Xb}$, $R^{Xc}$, and $R^{Xd}$ are groups of the formula (3); and $R^{X11}$, $R^{X12}$, $R^{X13}$, $R^{X21}$, $R^{X22}$, and $R^{X23}$ are hydrogen atoms. In this case, it is more preferable that the groups of the formula (3) as $R^{Xb}$, $R^{Xc}$, and $R^{Xd}$ be the same.

In the present specification, the explanations relating to the X ring, $R^{Xa}$, $R^{Xb}$, $R^{Xc}$, and $R^{Xd}$ in the formula (1), and $R^1$, $R^2$, $R^3$, m, and n in the group of the formula (3), including the explanation about the group of the formula (4), can be combined in any way. Any epoxy resins represented by combinations thereof can be also used in the present invention.

The formula (1) can satisfy any of the following:

(iia) one or more hydrogen atoms bonded to one or more $R^{Xa-d}$ non-binding carbon atoms are not replaced; $R^{Xa}$ and $R^{Xb}$ of $R^{Xa}$, $R^{Xb}$, $R^{Xc}$, and $R^{Xd}$ are hydrogen atoms; and $R^{Xc}$ and $R^{Xd}$ are groups of the formula (3);

(iiia) one or more hydrogen atoms bonded to one or more $R^{Xa-d}$ non-binding carbon atoms are not replaced; $R^{Xa}$ of $R^{Xa}$, $R^{Xb}$, $R^{Xc}$, and $R^{Xd}$ is a hydrogen atom; and $R^{Xb}$, $R^{Xc}$, and $R^{Xd}$ are groups of the formula (3); or (iva) one or more hydrogen atoms bonded to one or more $R^{Xa-d}$ non-binding carbon atoms are not replaced; and all of $R^{Xa}$, $R^{Xb}$, $R^{Xc}$, and $R^{Xd}$ are groups of the formula (3).

In the case of (iia), preferable examples of the epoxy resin represented by the formula (1) include an epoxy resin represented by the following formula (1-iia):

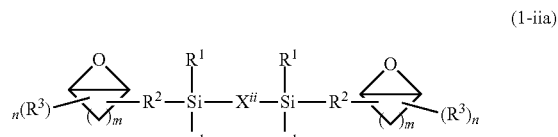

(1-iia)

wherein $X^{ii}$ is a divalent group obtained by removing two hydrogen atoms from a hydrocarbon ring, or a divalent group represented by the formula ($2^g$-iia):

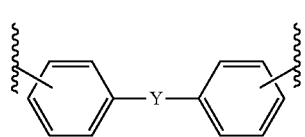
(2^g-iia)

wherein Y is as defined above; and $R^1$, $R^2$, $R^3$, m, and n are as defined above.

$R^1$, $R^2$, $R^3$, m, and n each may be the same or different, and are preferably the same.

The divalent group represented by $X^{ii}$ is preferably a cyclohexane-1,4-diyl group or a 1,4-phenylene group; and more preferably a 1,4-phenylene group.

Preferable among the divalent groups represented by the formula (2^g-iia) is a group represented by the formula (2^g-iia'):

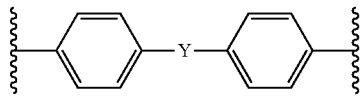
(2^g-iia')

wherein Y is as defined above.

In the formula (2^g-iia'), Y is preferably a bond, a dimethylmethylene group, an oxygen atom, or —SO$_2$—.

$X^{ii}$ is preferably a cyclohexane-1,4-diyl group, a 1,4-phenylene group, or a group of the formula (2^g-iia'); and more preferably a 1,4-phenylene group.

The present invention can more preferably use, for example, an epoxy resin represented by the formula (1-iia), wherein m is the same and is 0, 1, 2, 3, or 4 (particularly preferably m is the same and is 0 or 4); n is the same and is 0 (that is, the ring is not substituted with $R^3$) $X^{ii}$ is a divalent group obtained by removing two hydrogen atoms from a hydrocarbon ring (particularly preferably a benzene ring); $R^1$ is the same and is a $C_{1-3}$ alkyl group; and $R^2$ is the same and is a $C_{2-6}$ alkylene group, wherein one carbon atom that is not directly bonded to the silicon atom, and the 3- to 6-membered ring or epoxy ring may be replaced by an oxygen atom.

In the case of (iiia), the epoxy resins represented by the formula (1) preferably include an epoxy resin represented by the following formula (1-iiia):

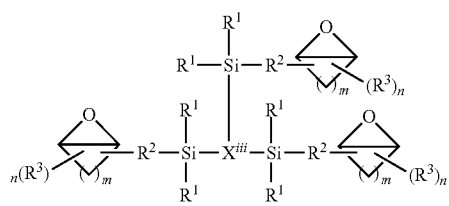
(1-iiia)

wherein $X^{iii}$ is a trivalent group obtained by removing three hydrogen atoms from a hydrocarbon ring, or a trivalent group represented by the formula (2^g-iiia):

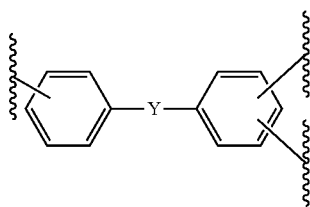
(2^g-iiia)

wherein Y is as defined above; and $R^1$, $R^2$, $R^3$, m, and n are as defined above.

$R^1$, $R^2$, $R^3$, m, and n each may be the same or different, and are preferably the same.

Preferable examples of the trivalent group represented by $X^{iii}$ include the following groups:

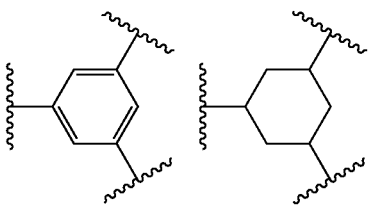

Preferable among the trivalent groups represented by the formula (2^g-iiia) include a group represented by the formula (2^g-iiia'):

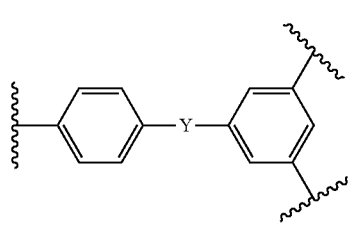
(2^g-iiia')

wherein Y is as defined above.

In the formula (2^g-iiia'), Y is particularly preferably a bond, a dimethylmethylene group, an oxygen atom, or —SO$_2$—.

The present invention can more preferably use, for example, an epoxy resin represented by the formula (1-iiia), wherein m is the same and is 0, 1, 2, 3, or 4 (particularly preferably m is the same and is 0 or 4); n is the same and is 0 (that is, the ring is not substituted with $R^3$); $X^{iii}$ is a trivalent group obtained by removing three hydrogen atoms from a hydrocarbon ring (particularly preferably a benzene ring); $R^1$ is the same and is a $C_{1-3}$ alkyl group; and $R^2$ is the same and is a $C_{2-6}$ alkylene group, wherein one carbon atom that is not directly bonded to the silicon atom and the 3- to 6-membered ring or epoxy ring may be replaced by an oxygen atom.

In the case of (iva), the epoxy resins represented by the formula (1) include an epoxy resin represented by the following formula (1-iva):

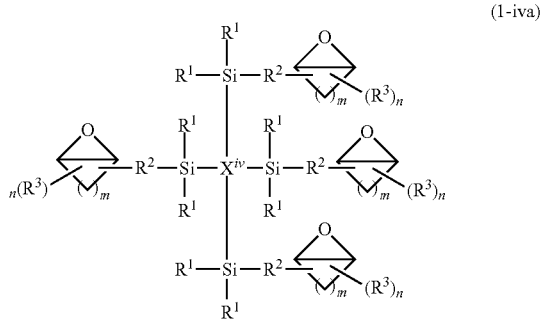

(1-iva)

wherein $X^{iv}$ is a tetravalent group represented by the above formula (1'), wherein one or more hydrogen atoms bonded to one or more $R^{Xa-d}$ non-binding carbon atoms in the X ring are not replaced;
and $R^1$, $R^2$, $R^3$, m, and n are as defined above.
$R^1$, $R^2$, $R^3$, m, and n each may be the same or different, and are preferably the same.

Preferable examples of the tetravalent group represented by $X^{iv}$ include the following groups:

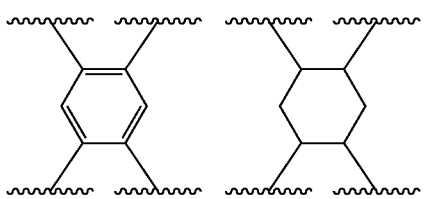

As the tetravalent group represented by $X^{iv}$, among tetravalent groups represented by the formula ($2^g$), wherein one or more hydrogen atoms bonded to one or more $R^{Xa-d}$ non-binding carbon atoms are not replaced, preferable is a group represented by the formula ($2^g$-iva'):

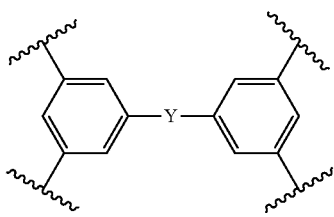

($2^g$-iva')

wherein Y is as defined above.

In the formula ($2^g$-iva'), Y is particularly preferably a bond, a dimethylmethylene group, an oxygen atom, or —SO$_2$—.

The present invention can more preferably use, for example, an epoxy resin represented by the formula (1-iva), wherein m is the same and is 0, 1, 2, 3, or 4 (particularly preferably m is the same and is 0 or 4); n is the same and is 0 (that is, the ring is not substituted with $R^3$); $X^{iv}$ is a tetravalent group obtained by removing four hydrogen atoms from a hydrocarbon ring (particularly preferably a benzene ring); $R^1$ is the same and is a $C_{1-3}$ alkyl group; and $R^2$ is the same and is a $C_{2-6}$ alkylene group, wherein one carbon atom that is not directly bonded to the silicon atom and the 3- to 6-membered ring or epoxy ring may be replaced by an oxygen atom.

More preferable among the epoxy resins represented by the formula (1) are specifically, for example, compounds represented by the formula (1-IIa):

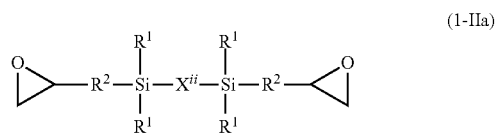

(1-IIa)

wherein $R^1$, $R^2$, and $X^{ii}$ are as defined above.

Preferable among the compounds represented by the formula (1-IIa) are compounds wherein $X^{ii}$ is a 1,4-phenylene group or a group represented by the formula ($2^g$-iia') (preferably a 1,4-phenylene group); $R^1$ is the same or different (preferably the same), and is a $C_{1-3}$ alkyl group (particularly a methyl group); and $R^2$ is the same or different (preferably the same), and is a $C_{2-6}$ alkylene group, (*)—(CH$_2$)$_2$—O—CH$_2$—, (*)—(CH$_2$)$_3$—O—CH$_2$—, (*)—(CH$_2$)$_3$—O—(CH$_2$)$_2$—, or (*)—(CH$_2$)$_5$—O—(CH$_2$)$_4$—. (*) represents the side of $R^2$ binding to the silicon atom, as described above.

More preferable among the epoxy resins represented by the above formula (1-IIa) is:

an epoxy resin represented by the formula (1-IIa1):

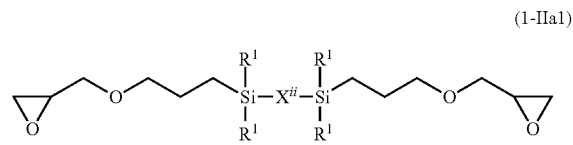

(1-IIa1)

wherein $R^1$ and $X^{ii}$ are as defined above; or
an epoxy resin represented by the formula (1-IIa2):

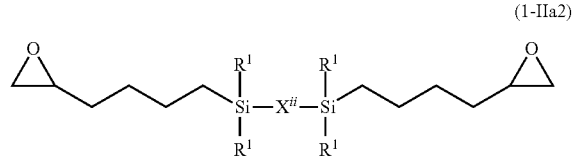

(1-IIa2)

wherein $R^1$ and $X^{ii}$ are as defined above.
$R^1$ may be the same or different, and is preferably the same.

More preferably, in the formula (1-IIa1) or (1-IIa2), $R^1$ is the same or different (preferably the same), and is a $C_{1-3}$ alkyl group (particularly a methyl group); and $X^{ii}$ is a 1,4-phenylene group or a group represented by the formula ($2^g$-iia').

More preferable among the epoxy resins represented by the formula (1) include an epoxy resin represented by the formula (1-IIb):

(1-IIb)

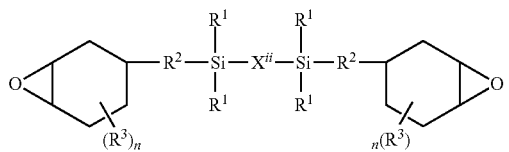

wherein $R^1$, $R^2$, $R^3$, $X^{ii}$, and n are as defined above.
$R^1$, $R^2$, $R^3$, and n each may be the same or different, and are preferably the same.

More preferably, in the formula (1-IIb), $X^{ii}$ is a 1,4-phenylene group or a group represented by the formula ($2^g$-iia') (preferably a 1,4-phenylene group); $R^1$ is the same or different (preferably the same), and is a $C_{1-3}$ alkyl group (particularly a methyl group); both n is 0 (that is, the ring is not substituted with $R^3$); and $R^2$ is the same or different (preferably the same), and is a $C_{2-6}$ alkylene group (preferably a dimethylene group: —$(CH_2)_2$—).

More preferable among the epoxy resins represented by the formula (1) is an epoxy resin represented by the formula (1-IIIa):

(1-IIIa)

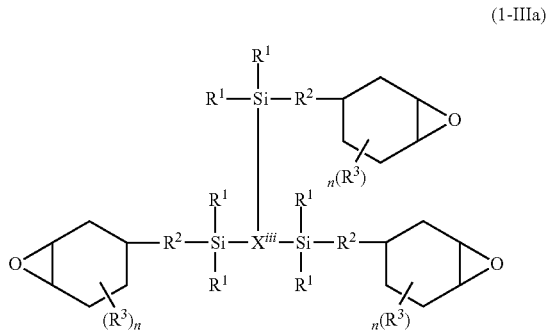

wherein $R^1$, $R^2$, $R^3$, $X^{iii}$, and n are as defined above.
$R^1$, $R^2$, $R^3$, and n each may be the same or different, and are preferably the same.

More preferably, in the formula (1-IIIa), $X^{iii}$ is

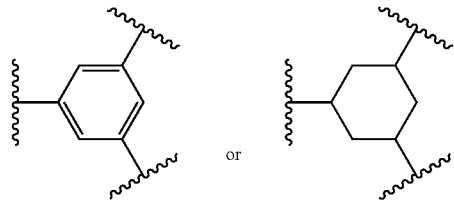

or a group represented by the formula ($2^g$-iiia'); $R^1$ is the same or different (preferably the same), and is a $C_{1-3}$ alkyl group (particularly a methyl group); both n is 0 (that is, the ring is not substituted with $R^3$); and $R^2$ is the same or different (preferably the same), and is a $C_{2-6}$ alkylene group (preferably a dimethylene group: —$(CH_2)_2$—).

In the epoxy resin composition of the present invention, the epoxy resins represented by the formula (1) can be used singly or in combination of two or more.

The epoxy resin represented by the formula (1) can be produced by or according to a known method, for example, based on or according to the disclosure of PTL 2 (GB1123960B). Moreover, the epoxy resin represented by the formula (1-iia) can be produced by, for example, a reaction represented by the following reaction formula:

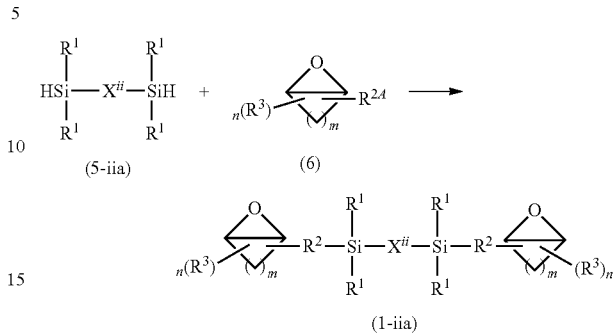

wherein $R^{2A}$ is a $C_{2-18}$ alkenyl group, wherein one or more carbon atoms of this group may be replaced by at least one atom selected from the group consisting of an oxygen atom and a nitrogen atom; and $R^1$, $R^2$, $R^3$, and $X^{ii}$ are as defined above.

The $C_{2-18}$ alkenyl group represented by $R^{2A}$ is a linear or branched alkenyl group, and preferably a linear alkenyl group. Specific examples include a vinyl group, an allyl group, a propenyl group, a butenyl group, a pentenyl group, a hexenyl group, a heptenyl group, an octenyl group, a norbornenyl group, a cyclohexenyl group, and the like. A $C_{2-10}$ alkenyl group is preferable; a $C_{2-8}$ alkenyl group is more preferable; a $C_{2-6}$ alkenyl group is even more preferable; and a vinyl group, an allyl group, or a butenyl group is particularly preferable. The alkenyl group is preferably an α-alkenyl group.

One or more carbon atoms of these $C_{2-18}$ alkylene groups may be replaced by at least one atom selected from the group consisting of an oxygen atom and a nitrogen atom (preferably an oxygen atom). The one or more carbon atoms are preferably carbon atoms that are not directly bonded to the epoxy ring. Moreover, the one or more carbon atoms that may be replaced are one or plural (e.g., 2, 3, 4, 5, or 6) carbon atoms, and preferably one carbon atom. Examples of this group include $C_{2-9}$ alkenyl-O—$C_{1-8}$ alkylene-, preferably $C_{2-4}$ alkenyl-O—$C_{1-3}$ alkylene-, more preferably $C_{2-4}$ alkenyl-O—$C_{1-2}$ alkylene-, and particularly preferably $C_3$ alkenyl-O—$CH_2$—. Specific examples include $CH_2$=CH—O—$CH_2$—, $CH_2$=CH—$CH_2$—O—$CH_2$—, $CH_2$=CH—$CH_2$—O—$(CH_2)_2$—, $CH_2$=CH—$(CH_2)_3$—O—$(CH_2)_4$—, and the like; among these, $CH_2$=CH—$CH_2$—O—$CH_2$— (allyloxymethyl group) is preferable.

The epoxy resin represented by the formula (1-iia) can be produced by hydrosilylation of the compound represented by the formula (5-iia) and the compound represented by the formula (6). Hydrosilylation can be generally performed in the presence of a catalyst in the presence or absence of a solvent. Moreover, when a compound represented by the formula (5-iiia):

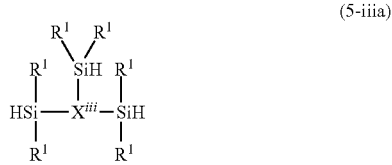

(5-iiia)

wherein $R^1$ and $X^{iii}$ are as defined above; or
the formula (5-iva):

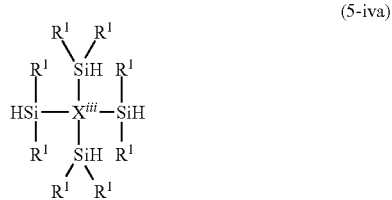

(5-iva)

wherein $R^1$ and $X^{iii}$ are as defined above; or
the formula (5-ia):

(5-ia)

wherein $X^i$ is a monovalent group obtained by removing one hydrogen atom from a hydrocarbon ring, and $R^1$ is as defined above;
is used in place of the compound represented by the formula (5-iiia), an epoxy resin represented by the above formula (1-iiia) or (1-iva), or an epoxy resin having a structure in which one group of the formula (3) is bonded to a hydrocarbon ring can also be produced. Moreover, various compounds represented by the formula (1) can be produced by using compounds having a structure in which $X^i$ to $X^{iv}$ are each replaced by a monovalent group obtained by removing one hydrogen atom from the X ring, a divalent group obtained by removing two hydrogen atoms from the X ring, a trivalent group obtained by removing three hydrogen atoms from the X ring, or a tetravalent group obtained by removing four hydrogen atoms from the X ring.

The catalyst used in hydrosilylation may be a known catalyst. Examples include platinum-based catalysts, such as platinum carbon, chloroplatinic acid, olefin complexes of platinum, alkenylsiloxane complexes of platinum, and carbonyl complexes of platinum; rhodium-based catalysts, such as tris(triphenylphosphine)rhodium; and iridium-based catalysts, such as bis(cyclooctadienyl)dichloroiridium. These catalysts may be in the form of solvates (e.g., hydrates, alcoholates, etc.). Further, the catalyst may be used in the form of a solution obtained by dissolving the catalyst in an alcohol (e.g., ethanol) when used. These catalysts can be used singly or in combination of two or more.

The amount of the catalyst used may be an effective amount as the catalyst. For example, the amount of the catalyst used is generally 0.00001 to 20 parts by mass, and preferably 0.0005 to 5 parts by mass, based on the total amount of 100 parts by mass of the compound represented the formula (5-ia), (5-iia), (5-iiia), or (5-iva), and the compound represented by the formula (6).

Although hydrosilylation proceeds without use of a solvent, the reaction can be carried out under milder conditions by using a solvent. Examples of solvents include aromatic hydrocarbon solvents, such as toluene and xylene; aliphatic hydrocarbon solvents, such as hexane and octane; ether solvents, such as tetrahydrofuran and dioxane; alcohol solvents, such as ethanol and isopropanol; and the like. These may be used singly or in combination of two or more.

The amount of the compound represented by the formula (6) is, for example, generally 0.5 to 2 mol, preferably 0.6 to 1.5 mol, and more preferably 0.8 to 1.2 mol, per mol of the Si—H group in the compound represented by the formula (5-ia), (5-iia), (5-iiia), or (5-iva).

The reaction temperature is generally 0° C. to 150° C., and preferably 10° C. to 120° C. The reaction time is generally about 1 hour to 24 hours.

After completion of the reaction, the solvent is distilled off from the reaction mixture, or a known isolation method is used, thereby obtaining an epoxy resin represented by the formula (1).

Phenol resins are preferably used as the phenol-based curing agent used in the present invention. Phenol resins are obtained by condensation reaction of phenols and aldehydes. Specific examples include bisphenol-type resins, such as bisphenol A, bisphenol F, bisphenol S, and bisphenol AD; novolak-type phenol resins, such as phenol novolak resin, cresol novolak resin, cyclopentadiene cresol novolak resin, cyclopentadienephenol novolak resin, naphthol novolak resin, trisphenol novolak resin, tetrakis phenol novolak resin, and bisphenol A novolak resin; modified novolak resins, such as paraxylylene-modified novolak resin, metaxylylene-modified novolak resin, and orthoxylylene-modified novolak resin; resol-type phenol resins, such as aniline-modified resole resin and dimethyl ether resole resin; biphenyl-type phenol resins; aralkyl-type phenol resins, such as phenol aralkyl resin and biphenyl aralkyl resin; phenol resins, such as triphenolalkane-type resins (e.g., triphenolmethane-type resin and triphenolpropane-type resin) and polymers thereof; naphthalene ring-containing phenol resins, dicyclopentadiene-modified phenol resins; polyhydric phenol resins obtained by condensation reaction of various phenols and various aldehydes, such as benzaldehyde, hydroxybenzaldehyde, crotonaldehyde, and glyoxal; polyhydric phenol resins obtained by condensation reaction of xylene resins and phenols; co-condensation resins of heavy oil or pitches, phenols, and formaldehydes; phenol-benzaldehyde-xylylene dimethoxide polycondensation products; phenol-benzaldehyde-xylylene dihalide polycondensation products; phenol-benzaldehyde-4,4'-dimethoxide biphenyl polycondensation products; phenol-benzaldehyde-4,4'-dihalide biphenyl polycondensation products; and other various phenol resins. The phenol-based curing agents may be used singly or in combination of two or more.

As the phenol-based curing agent used in the present invention, novolak-type phenol resins, resol-type phenol resins, and aralkyl-type phenol resins are preferable; novolak-type phenol resins and aralkyl-type phenol resins are more preferable; and phenol novolak resins and phenol aralkyl resins are even more preferable. When phenols and aldehydes are reacted, novolak-type phenol resins are produced in the presence of an acid catalyst, and resol-type phenol resins are produced in the presence of an alkali catalyst.

More specifically, for example, a resin represented by the following formula (7):

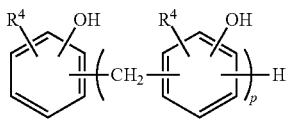

wherein $R^4$ is the same or different, and is a hydrogen atom, a lower alkyl group, or a lower alkylol group; and p is an average value of 1 to 30;
can be preferably used.

The lower alkyl group mentioned herein refers to a $C_{1-9}$ alkyl group, preferably a $C_{1-6}$ alkyl group, and more preferably a $C_{1-4}$ alkyl group. The lower alkyl group may be linear or branched. Specific preferable examples include a methyl group, an ethyl group, an n-propyl group, an isopropyl group, an n-butyl group, an isobutyl group a t-butyl group, and the like.

The lower alkylol group mentioned herein refers to a $C_{1-9}$ alkylol group, preferably a $C_{1-6}$ alkylol group, more preferably a $C_{1-4}$ alkylol group, and even more preferably a $C_{1-2}$ alkylol group. The lower alkyl group may be linear or branched. Specific preferable examples include a methylol group, an ethylol group (1-ethylol group, 2-ethylol group), and the like.

In particular, $R^4$ is preferably the same or different, and is a hydrogen atom or a lower alkyl group, and more preferably a hydrogen atom or a methyl group. p is preferably an average value of 2 to 20, and more preferably 3 to 10.

Moreover, a resin represented by the following formula (8):

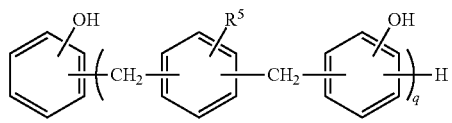

wherein $R^5$ is the same or different, and is a hydrogen atom or a lower alkyl group; and q is an average value of 1 to 15;
can also be preferably used.

The lower alkyl group mentioned herein refers to a $C_{1-9}$ alkyl group, preferably a $C_{1-6}$ alkyl group, and more preferably a $C_{1-4}$ alkyl group. The lower alkyl group may be liner or branched. Specific preferable examples include a methyl group, an ethyl group, an n-propyl group, an isopropyl group, an n-butyl group, an isobutyl group a t-butyl group, and the like.

$R^5$ is particularly preferably the same or different, and is a hydrogen atom or a methyl group.

q is preferably an average value of 1 to 10, and more preferably 2 to 5.

The mixing ratio of the phenol-based curing agent in the epoxy resin composition of the present invention is not particularly limited within the range in which the effects of the present invention can be exhibited. For example, the ratio of the equivalent of epoxy groups in the epoxy resin to the equivalent of reactive functional groups (hydroxyl groups) in the phenol-based curing agent is preferably 10:90 to 90:10, more preferably 20:80 to 80:20, even more preferably 30:70 to 70:30, and still more preferably 40:60 to 60:40.

Although it depends on the ratio of the equivalent of epoxy groups in the epoxy resin to the equivalent of reactive functional groups in the phenol-based curing agent, the amount of the phenol-based curing agent is, for example, preferably 10 to 150 parts by mass, more preferably 20 to 100 parts by mass, and even more preferably 30 to 80 parts by mass, based on 100 parts by mass of the epoxy resin in the epoxy resin composition.

In the epoxy resin composition of the present invention, a curing accelerator may be used in combination, when the above curing agent is used. Examples include imidazoles, such as 2-methylimidazole, 2-ethylimidazole, 2-phenylimidazole, and 2-ethyl-4-methylimidazole; tertiary amines, such as 2-(dimethylaminomethyl)phenol, triethylenediamine, triethanolamine, and 1,8-diazabicyclo(5,4,0)undecene-7; organic phosphines, such as triphenylphosphine, diphenylphosphine, and tributylphosphine; metal compounds, such as tin octylate; phosphonium salts, such as ethyltriphenylphosphonium bromide and tetraphenylphosphonium tetraphenylborate; and the like.

As the curing accelerator used in the present invention, imidazoles, organic phosphines, and phosphonium salts are preferable; organic phosphines are more preferable; and triphenylphosphine is particularly preferable.

The amount of the curing accelerator used is preferably 0.01 to 10.0 parts by mass, and more preferably 0.1 to 5 parts by mass, based on 100 parts by mass of the epoxy resin in the epoxy resin composition.

The epoxy resin composition of the present invention may contain an epoxy resin other than the epoxy resin represented by the formula (1) within a range that does not impair the effects of the present invention. Examples include bisphenol A epoxy resins, bisphenol F epoxy resins, phenol novolak epoxy resins, cresol novolak epoxy resins, cycloaliphatic epoxy resins, brominated epoxy resins, triglycidyl isocyanurate and hydantoin epoxy resins, both of which are nitrogen-containing ring epoxy resins, hydrogenated bisphenol A epoxy resins, aliphatic epoxy resins, glycidyl ether epoxy resins, bisphenol S epoxy resins, biphenyl epoxy resins, dicyclo epoxy resins, naphthalene epoxy resins, and the like. These epoxy resins may be used singly or in combination of two or more.

When an epoxy resin other than the epoxy resin represented by the formula (1) is mixed, the mixing ratio of the epoxy resin represented by the formula (1) to the epoxy resin other than the epoxy resin represented by the formula (1) is, by mass ratio, for example, 100:0 to 20:80, preferably 100:0 to 30:70, and more preferably 100:0 to 40:60.

The epoxy resin composition of the present invention may contain, if necessary, fillers, curing agents, thermoplastic resins, additives, etc., within a range that does not impair the objects and effects of the present invention.

The above fillers can be used singly or in combination of two or more, in consideration of flowability, heat resistance, low thermal expansion properties, mechanical characteristics, hardness, scratch resistance, adhesion, etc. that are required for compositions and cured products. Examples include inorganic compounds, such as silica (specifically crystalline silica, fused silica, spherical fused silica, etc.), titanium oxide, zirconium oxide, zinc oxide, tin oxide, silicon nitride, silicon carbide, boron nitride, calcium carbonate, calcium silicate, potassium titanate, aluminum nitride, indium oxide, alumina, antimony oxide, cerium oxide, magnesium oxide, iron oxide, and tin-doped indium oxide (ITO). Other examples include metals, such as gold, silver, copper, aluminum, nickel, iron, zinc, and stainless steel. Still other examples include minerals, such as montmorillonite, talc, mica, boehmite, kaolin, smectite, zonolite, vermiculite, and sericite. Examples of other fillers include carbon compounds, such as carbon black, acetylene black, Ketchen black, and carbon nanotubes; metal hydroxides, such as aluminum hydroxide and magnesium hydroxide; various types of glass, such as glass beads, glass flakes, and glass balloons; and the like. The filler may be used in a powder form, or may be used after being dispersed in a resin.

Examples of curing agents include amine-based curing agents, amide-based curing agents, acid anhydride-based curing agents, mercaptan-based curing agents, isocyanate-based curing agents, active ester-based curing agents, cyanate ester-based curing agents, and the like. The curing agents may be used singly or in combination of two or more because they can be properly used corresponding to the required characteristics.

Examples of amine-based curing agents include chain aliphatic amines, such as ethylenediamine, diethylenetriamine, triethylenetetramine, and tetraethylenepentamine; alicyclic amines, such as isophoronediamine, benzenediamine, bis(4-aminocyclohexyl)methane, bis(aminomethyl)cyclohexane, and diaminodicyclohexylmethane; aromatic amines, such as metaphenylenediamine, diaminodiphenylmethane, diethyltoluenediamine, and diaminodiethyldiphenylmethane; secondary and tertiary amines, such as benzyldimethylamine, triethylenediamine, piperidine, 2-(dimethylaminomethyl)phenol, 2,4,6-tris(dimethylaminomethyl)phenol, DBU (1,8-diazabicyclo(5,4,0)-undecene-7), DBN (1,5-diazabicyclo(4,3,0)-nonene-5), and the like.

Examples of amide-based curing agents include dicyandiamide and derivatives thereof, polyamide resins (e.g., polyaminoamide), and the like.

Examples of acid anhydride-based curing agents include aliphatic acid anhydrides, such as maleic anhydride and dodecenylsuccinic anhydride; aromatic acid anhydrides, such as phthalic anhydride, trimellitic anhydride, and pyromellitic dianhydride; alicyclic acid anhydrides, such as methylnadic anhydride, tetrahydrophthalic anhydride, methyltetrahydrophthalic anhydride, hexahydrophthalic anhydride, and 4-methylhexahydrophthalic anhydride; and the like.

Examples of mercaptan-based curing agents include trimethylolpropane tris(3-mercaptopropionate), tris-[(3-mercaptopropionyloxy)-ethyl]-isocyanurate, pentaerythritol tetrakis(3-mercaptopropionate), tetraethyleneglycol bis(3-mercaptopropionate), pentaerythritol tetrakis(3-mercaptobutyrate), 1,4-bis(3-mercaptobutyryloxy)butane, trimethylolpropane tris(3-mercaptobutyrate), trimethylolethane tris(3-mercaptobutyrate), polysulfide polymers, and the like.

Examples of isocyanate-based curing agents include hexamethylene diisocyanate, 1,4-tetramethylene diisocyanate, 2-methylpentane-1,5-diisocyanate, lysine diisocyanate, isophorone diisocyanate, norbornane diisocyanate, and the like.

Examples of active ester-based curing agents include compounds having, per molecule, one or more ester groups reactive with epoxy resins. Specific examples include phenol esters, thiophenol esters, N-hydroxyamine esters, heterocyclic ring hydroxy compound esters, and the like.

Examples of thermoplastic resins include polyolefin resins, acrylic resins, phenoxy resins, polyamide resins, polyester resins, polycarbonate resins, polyurethane resins, polyarylate resins, polyphenylene ether resins, polyacetal resins, acid-modified products thereof, and the like. In terms of compatibility with the epoxy resin composition of the present invention and heat resistance, polyolefin resins, acrylic resins, phenoxy resins, polyarylate resins, polyphenylene ether resins, and acid-modified products thereof are preferable; and more preferable among these are polyolefin resins and acid-modified polyolefin resins.

Examples of additives include antioxidants, inorganic fluorescent substances, lubricants, ultraviolet absorbers, heat light stabilizers, antistatic agents, polymerization inhibitors, antifoaming agents, solvents, anti-aging agents, radical inhibitors, adhesion-improving agents, flame retardants, surfactants, storage stability-improving agents, ozone aging inhibitors, thickeners, plasticizers, radiation-blocking agents, nucleating agents, coupling agents, conductivity-imparting agents, phosphorus-based peroxide-decomposing agents, pigments, metal deactivators, physical property-controlling agents, and the like.

A cured product can be obtained by curing the epoxy resin composition of the present invention (i.e., a cured product of the epoxy resin composition). The curing method is not particularly limited. For example, a method that cures the composition by heating can be used. The curing temperature is generally room temperature to 250° C. The curing time varies depending on the composition, and can be generally widely set from 30 minutes to 1 week. Moreover, for example, a varnish can be prepared by dissolving the epoxy resin composition in a solvent (e.g., an organic solvent, such as toluene, xylene, methyl ethyl ketone, acetone, cyclohexanone, methylcyclohexane, or cyclohexane) within a range that does not adversely affect the effects of the present invention. Further, a cured product of a desired shape can also be obtained using this varnish. For example, a film-like cured product can be obtained by applying the varnish to a substrate (e.g., copper foil, aluminum foil, or a polyimide film), and heating the applied varnish. The curing temperature is generally room temperature to 200° C. The curing time varies depending on the composition liquid, and can be generally widely set from 30 minutes to 1 week. The present invention also preferably includes such a varnish and a cured product.

In the present specification, the term "comprising" includes "consisting essentially of" and "consisting of."

EXAMPLES

The present invention is described in more detail below; however, the present invention is not limited to the following examples.

Production Example 1 (Production of Epoxy Resin A)

Allyl glycidyl ether (5.9 g), 0.05 g of 2 wt % ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 4 hours. After the toluene was removed by concentration, 10.3 g (epoxy equivalent: 211 g/eq) of 1,4-bis[(2,3-epoxypropyloxypropyl)dimethylsilyl]benzene (epoxy resin A) was obtained as a colorless, transparent liquid.

Production Example 2 (Production of Epoxy Resin B)

1,2-Epoxy-5-hexene (5.0 g), 0.05 g of 2 wt % ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 5 hours. After the toluene was removed by concentration, 9.5 g (epoxy equivalent: 195 g/eq) of 1,4-bis[(2,3-epoxybutyl)dimethylsilyl]benzene (epoxy resin B) was obtained as a colorless, transparent liquid.

Production Example 3 (Production of Epoxy Resin C)

1,2-Epoxy-4-vinylcyclohexane (6.4 g), 0.05 g of 2 wt % ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 4 hours. After the toluene was removed by concentration, 10.8 g (epoxy equivalent: 221 g/eq) of 1,4-bis{[2-(3,4-epoxycyclohexyl)ethyl]dimethylsilyl}benzene (epoxy resin C) was obtained as a colorless, transparent liquid.

Production Example 4 (Production of Epoxy Resin D)

1,2-Epoxy-4-vinylcyclohexane (4.3 g), 0.05 g of 2 wt % ethanol solution of hexachloroplatinic acid hexahydrate, and 250 g of toluene were placed in a 200-mL four-necked flask equipped with a stirrer, a thermometer, and a condenser in a nitrogen atmosphere, and the liquid temperature was raised to 70° C. Thereafter, 5.0 g of bis[(p-dimethylsilyl)phenyl] ether was added dropwise for 15 minutes, and the mixture was then stirred at 90° C. for 6 hours. After the toluene was removed by concentration, 8.9 g (epoxy equivalent: 267 g/eq) of 4,4'-bis{[2-(3,4-epoxycyclohexyl)ethyl]dimethylsilyl}diphenyl ether (epoxy resin D) was obtained as a colorless, transparent liquid.

Production Example 5 (Production of Epoxy Resin E)

1,2-Epoxy-4-vinylcyclohexane (7.4 g), 0.05 g of 2 wt % ethanol solution of hexachloroplatinic acid hexahydrate, and 250 g of toluene were placed in a 200-mL four-necked flask equipped with a stirrer, a thermometer, and a condenser in a nitrogen atmosphere, and the liquid temperature was raised to 70° C. Thereafter, 5.0 g of 1,3,5-tris(dimethylsilyl)benzene was added dropwise for 15 minutes, and the mixture was then stirred at 90° C. for 6 hours. After the toluene was removed by concentration, 11.8 g (epoxy equivalent: 208 g/eq) of 1,3,5-tris{[2-(3,4-epoxycyclohexyl)ethyl]dimethylsilyl}benzene (epoxy resin E) was obtained as a colorless, transparent liquid.

Examples 1 to 5 and Comparative Examples 1 to 3

First, the raw materials used in the present Examples and Comparative Examples are collectively shown below.
Epoxy resin F: Bis-A epoxy resin (Grade 828) produced by Mitsubishi Chemical Corporation (epoxy equivalent: 189 g/eq)
Epoxy resin G: cycloaliphatic epoxy resin (Celloxide 2021P; general name: 3',4'-epoxycyclohexylmethyl 3,4-epoxycyclohexane carboxylate) produced by Daicel Corporation (epoxy equivalent: 137 g/eq)
Epoxy resin H: cycloaliphatic epoxy resin (FOLDIE-201, produced by Nissan Chemical Industries, Ltd.) (epoxy equivalent: 285 g/eq)
Phenol-based curing agent: phenol novolak resin (TD-2131, produced by DIC)
Curing accelerator: triphenylphosphine (TPP, produced by Tokyo Chemical Industry Co., Ltd.)

The structural formula of the epoxy resin G (Celloxide 2021P) is shown below.

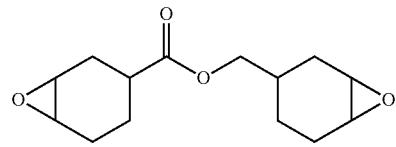

Further, the structural formula of the epoxy resin H (FOLDIE-201) is shown below.

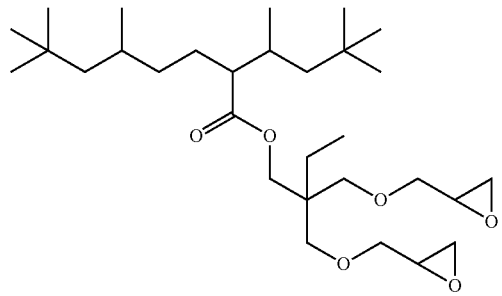

Moreover, the structural formula of the phenol-based curing agent (phenol novolak resin: TD-2131) is shown below.

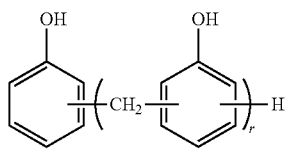

wherein r is an average value of 5.

Example 1

A phenol novolak resin (47 parts by mass) was added to 47 parts by mass of acetone, and dissolved by stirring with a magnetic stirrer at room temperature (25° C.) for 30 minutes. Epoxy resin A (100 parts by mass) and 2 parts by mass of TPP were added thereto, and the mixture was uniformly mixed. Thereafter, degassing was sufficiently performed to thereby prepare a varnish of an epoxy resin composition.

Example 2

A phenol novolak resin (49 parts by mass) was added to 49 parts by mass of acetone, and dissolved by stirring with a magnetic stirrer at room temperature (25° C.) for 30 minutes. Epoxy resin B (100 parts by mass) and 2 parts by mass of TPP were added thereto, and the mixture was uniformly mixed. Thereafter, degassing was sufficiently performed to thereby prepare a varnish of an epoxy resin composition.

Example 3

A phenol novolak resin (49 parts by mass) was added to 49 parts by mass of acetone, and dissolved by stirring with a magnetic stirrer at room temperature (25° C.) for 30 minutes. Epoxy resin C (100 parts by mass) and 2 parts by mass of TPP were added thereto, and the mixture was uniformly mixed. Thereafter, degassing was sufficiently performed to thereby prepare a varnish of an epoxy resin composition.

Example 4

A phenol novolak resin (41 parts by mass) was added to 49 parts by mass of acetone, and dissolved by stirring with a magnetic stirrer at room temperature (25° C.) for 30 minutes. Epoxy resin D (100 parts by mass) and 2 parts by mass of TPP were added thereto, and the mixture was uniformly mixed. Thereafter, degassing was sufficiently performed to thereby prepare a varnish of an epoxy resin composition.

Example 5

A phenol novolak resin (54 parts by mass) was added to 49 parts by mass of acetone, and dissolved by stirring with a magnetic stirrer at room temperature (25° C.) for 30 minutes. Epoxy resin E (100 parts by mass) and 2 parts by mass of TPP were added thereto, and the mixture was uniformly mixed. Thereafter, degassing was sufficiently performed to thereby prepare a varnish of an epoxy resin composition.

Comparative Example 1

A phenol novolak resin (55 parts by mass) was added to 55 parts by mass of acetone, and dissolved by stirring with a magnetic stirrer at room temperature (25° C.) for 30 minutes. Epoxy resin F (100 parts by mass) and 2 parts by mass of TPP were added thereto, and the mixture was uniformly mixed. Thereafter, degassing was sufficiently performed to thereby prepare a varnish of an epoxy resin composition.

Comparative Example 2

A phenol novolak resin (76 parts by mass) was added to 76 parts by mass of acetone, and dissolved by stirring with a magnetic stirrer at room temperature (25° C.) for 30 minutes. Epoxy resin G (100 parts by mass) and 2 parts by mass of TPP were added thereto, and the mixture was uniformly mixed. Thereafter, degassing was sufficiently performed to thereby prepare a varnish of an epoxy resin composition.

Comparative Example 3

A phenol novolak resin (36 parts by mass) was added to 36 parts by mass of acetone, and dissolved by stirring with a magnetic stirrer at room temperature (25° C.) for 30 minutes. Epoxy resin H (100 parts by mass) and 2 parts by mass of TPP were added thereto, and the mixture was uniformly mixed. Thereafter, degassing was sufficiently performed to thereby prepare a varnish of an epoxy resin composition.

In the Examples and Comparative Examples, the ratio of the equivalent of epoxy groups in the epoxy resin to the equivalent of reactive functional groups (hydroxyl groups) in the phenol-based curing agent (phenol novolak resin) was adjusted to 50:50.

90-Degree Peel Strength Against Copper Foil

The varnishes obtained in Examples 1 to 5 and Comparative Examples 1 to 3 were each applied to electrolytic copper foil (FHG-WS, produced by Furukawa Electric Co., Ltd.; Rz of treated surface=1.2 μm), and dried under reduced pressure at room temperature for 1 hour, thereby forming adhesive films with copper foil. A polished aluminum plate was bonded to the resin surface of each film, and the resulting products were cured by heating at 100° C. for 1 hour, 120° C. for 2 hours, and 150° C. for 2 hours. After curing, cuts with a width of 1 cm were made with a cutter, thereby preparing 90-degree peel strength test pieces. The obtained test pieces were each subjected to a 90-degree peel strength test using AGS-X (produced by Shimadzu Corp.) at a test rate of 50 mm/min.

Dielectric Constant and Dielectric Loss Tangent

The varnishes obtained in Examples 1 to 5 and Comparative Examples 1 to 3 were each applied to a TPX plate (produced by Mitsui Chemicals, Inc.; thickness: 2 mm), dried under reduced pressure at room temperature for 1 hour, and then cured by heating at 100° C. for 1 hour, 120° C. for 2 hours, and 150° C. for 2 hours. Subsequently, the cured products were each cut into size of 30 mm width×30 mm length×0.5 mm thickness, thereby preparing test pieces. The relative dielectric constant (1 GHz) and the dielectric loss tangent (1 GHz) of each of the obtained test pieces were measured using a dielectric constant measuring device (Impedance Analyzer, produced by Agilent) at 25° C. The dielectric constant measuring device was calibrated with PTFE.

The above results are summarized in Table 1.

TABLE 1

|  | Example 1 | Example 2 | Example 3 | Example 4 | Example 5 | Comparative Example 1 | Comparative Example 2 | Comparative Example 3 |
|---|---|---|---|---|---|---|---|---|
| Epoxy resin A | 100 | 0 | 0 | 0 | 0 | 0 | 0 | 0 |
| Epoxy resin B | 0 | 100 | 0 | 0 | 0 | 0 | 0 | 0 |
| Epoxy resin C | 0 | 0 | 100 | 0 | 0 | 0 | 0 | 0 |
| Epoxy resin D | 0 | 0 | 0 | 100 | 0 | 0 | 0 | 0 |
| Epoxy resin E | 0 | 0 | 0 | 0 | 100 | 0 | 0 | 0 |

TABLE 1-continued

| | Example 1 | Example 2 | Example 3 | Example 4 | Example 5 | Comparative Example 1 | Comparative Example 2 | Comparative Example 3 |
|---|---|---|---|---|---|---|---|---|
| Epoxy resin F | 0 | 0 | 0 | 0 | 0 | 100 | 0 | 0 |
| Epoxy resin G | 0 | 0 | 0 | 0 | 0 | 0 | 100 | 0 |
| Epoxy resin H | 0 | 0 | 0 | 0 | 0 | 0 | 0 | 100 |
| Phenol-based curing agent | 47 | 49 | 49 | 41 | 54 | 55 | 76 | 36 |
| Curing accelerator | 2 | 2 | 2 | 2 | 2 | 2 | 2 | 2 |
| Peel strength (N/cm) | 9.2 | 11.8 | 11.9 | 9.0 | 10.0 | 9.0 | 9.2 | 11.5 |
| Relative dielectric constant (1 GHz) | 2.9 | 2.9 | 2.9 | 2.9 | 2.9 | 3.4 | 3.4 | 3.1 |
| Dielectric loss tangent (1 GHz) | 0.011 | 0.012 | 0.015 | 0.011 | 0.012 | 0.033 | 0.024 | 0.017 |

The epoxy resin compositions described in Examples 1 to 5 exhibited equivalent or superior adhesion, and superior relative dielectric constant and dielectric loss tangent, compared with the epoxy resin compositions of Comparative Examples 1 to 3.

The invention claimed is:

1. An epoxy resin composition comprising an epoxy resin and a phenol-based curing agent, the epoxy resin being at least one epoxy resin selected from the group consisting of:

an epoxy resin represented by the formula (1-iia):

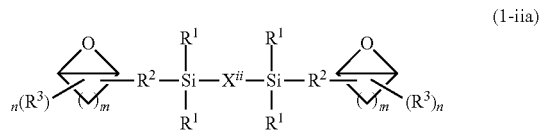

(1-iia)

wherein $X^{ii}$ is a divalent group obtained by removing two hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a divalent group represented by the formula ($2^g$-iia):

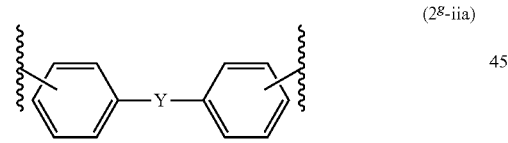

($2^g$-iia)

wherein Y is a bond, a $C_{1-6}$ alkylene group that may be substituted with a $C_{1-4}$ alkyl group, an oxygen atom (—O—), a sulfur atom (—S—), —SO—, or —SO$_2$—;

$R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

m is an integer of 0 to 6; and n is an integer of 0 to 3; and an epoxy resin represented by the formula (1-iiia):

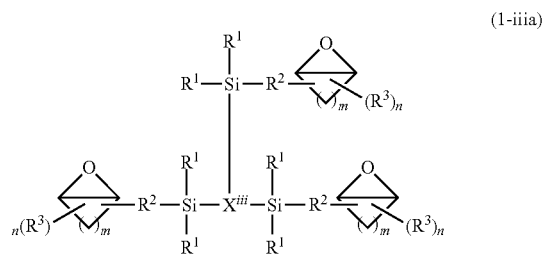

(1-iiia)

wherein $X^{iii}$ is a trivalent group obtained by removing three hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a trivalent group represented by the formula ($2^g$-iiia):

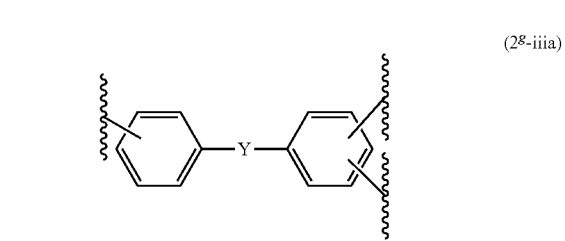

($2^g$-iiia)

wherein Y is as defined above; and $R^1$, $R^2$, $R^3$, m, and n are as defined above, wherein the phenol-based curing agent is at least one resin selected from the group consisting of a novolak-type phenol resin, a resol-type phenol resin, and an aralkyl-type phenol resin, and the amount of the phenol-based curing agent is 10 to 150 parts by mass based on 100 parts by mass of the epoxy resin in the epoxy resin composition.

2. The epoxy resin composition according to claim 1, wherein the epoxy resin composition further comprises (ii) an epoxy resin other than the epoxy resin represented by the formula (1-iia) or (1-iiia), and the ratio of the epoxy resin represented by the formula (1-iia) or (1-iiia) to the epoxy resin (ii) is, by mass ratio, 100:0 to 30:70.

3. The epoxy resin composition according to claim 1, wherein the at least one epoxy resin is selected from the group consisting of:

an epoxy resin represented by the formula (1-IIa):

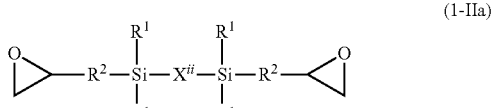

(1-IIa)

wherein $R^1$, $R^2$, and $X^{ii}$ are as defined above,
an epoxy resin represented by the formula (1-IIb):

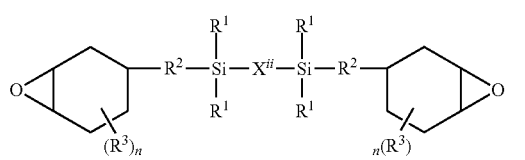

(1-IIb)

wherein $R^1$, $R^2$, $R^3$, $X^{ii}$, and n are as defined above, and
an epoxy resin represented by the formula (1-IIIa):

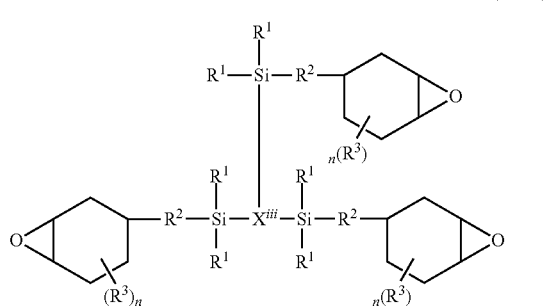

(1-IIIa)

wherein $R^1$, $R^2$, $R^3$, $X^{iii}$, and n are as defined above.

4. The epoxy resin composition according to claim 1, wherein the phenol-based curing agent is a novolak-type phenol resin.

5. The epoxy resin composition according to claim 1, wherein the phenol-based curing agent is at least one resin selected from the group consisting of:

a resin represented by the formula (7):

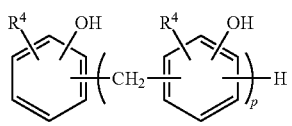

(7)

wherein $R^4$ is the same or different, and is a hydrogen atom, a lower alkyl group, or a lower alkylol group; and p is an average value of 1 to 30; and a resin represented by the formula (8):

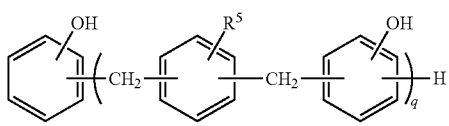

(8)

wherein $R^5$ is the same or different, and is a hydrogen atom or a lower alkyl group; and q is an average value of 1 to 15.

6. The epoxy resin composition according to claim 1, further comprising a curing accelerator.

7. A varnish comprising the epoxy resin composition according to claim 1, and an organic solvent.

8. A semiconductor sealing material, a liquid sealing material, a potting material, a sealing material, an interlayer insulation film, an adhesive layer, a coverlay film, an electromagnetic shielding film, a printed circuit board material, or a composite material, each comprising the varnish according to claim 7.

9. A cured product of the epoxy resin composition according to claim 1.

10. A semiconductor sealing material, a liquid sealing material, a potting material, a sealing material, an interlayer insulation film, an adhesive layer, a coverlay film, an electromagnetic shielding film, a printed circuit board material, or a composite material, each comprising the cured product according to claim 9.

11. A semiconductor sealing material, a liquid sealing material, a potting material, a sealing material, an interlayer insulation film, an adhesive layer, a coverlay film, an electromagnetic shielding film, a printed circuit board material, or a composite material, each comprising the epoxy resin composition according to claim 1.

12. The epoxy resin composition according to claim 1, further comprising a filler.

* * * * *